US011727168B2

(12) United States Patent
Masuda et al.

(10) Patent No.: US 11,727,168 B2
(45) Date of Patent: Aug. 15, 2023

(54) PROACTIVE VEHICLE MAINTENANCE SCHEDULING BASED ON DIGITAL TWIN SIMULATIONS

(71) Applicant: TOYOTA JIDOSHA KABUSHIKI KAISHA, Toyota (JP)

(72) Inventors: Takato Masuda, Toyota (JP); BaekGyu Kim, Mountain View, CA (US); Shinichi Shiraishi, Mountain View, CA (US)

( * ) Notice: Subject to any disclaimer, the term of this patent is extended or adjusted under 35 U.S.C. 154(b) by 547 days.

(21) Appl. No.: 15/908,768

(22) Filed: Feb. 28, 2018

(65) Prior Publication Data

US 2019/0266295 A1     Aug. 29, 2019

(51) Int. Cl.
*G06F 30/20*     (2020.01)
*G07C 5/08*     (2006.01)

(52) U.S. Cl.
CPC ............. *G06F 30/20* (2020.01); *G07C 5/085* (2013.01)

(58) Field of Classification Search
CPC ..... G06F 17/5009; G07C 5/085; G07C 5/008; G06Q 50/30; G06Q 10/20
USPC ........................................................ 701/31.9
See application file for complete search history.

(56) References Cited

U.S. PATENT DOCUMENTS

2018/0101775 A1\* 4/2018 Fish ........................ G06Q 10/04
2018/0257683 A1\* 9/2018 Govindappa ....... B61L 27/0077

FOREIGN PATENT DOCUMENTS

| CN | 107462425 | \* | 12/2017 |
| CN | 107462425 | A | 12/2017 |
| JP | 2002-109095 | | 4/2002 |
| JP | 2004272375 | A \* | 9/2004 |
| JP | PO2004-272375 | \* | 9/2004 |
| JP | 2005-162148 | | 6/2005 |
| JP | 2013-221828 | | 10/2013 |
| JP | 2017-206239 | | 11/2017 |
| JP | 2017206239 | A \* | 11/2017 |
| JP | 2018-127209 | | 8/2018 |
| WO | 2005106139 | | 11/2005 |

(Continued)

OTHER PUBLICATIONS

NIKKEI Electronics, vol. 1166, Mar. 20, 2016, pp. 56-61.

(Continued)

*Primary Examiner* — Maceeh Anwari
(74) *Attorney, Agent, or Firm* — Burbage Law, P.C.; Jon-Michael Burbage

(57) ABSTRACT

The disclosure includes embodiments for proactive vehicle maintenance scheduling based on one or more digital twin simulations. A method includes generating a digital twin of a vehicle. The method includes receiving digital data recorded by a sensor and describing the vehicle as it exists in a real-world and one or more historical journeys of the vehicle in the real-world. The method includes updating the digital twin of the vehicle based on the digital data describing the vehicle so that the digital twin is consistent with a condition of the vehicle as it exists in the real-world. The method includes executing a simulation based on the digital twin and the one or more historical journeys. The method includes estimating a component of the vehicle that fails at a future time based on the simulation. The method includes scheduling a reservation to repair the component before the future time.

20 Claims, 8 Drawing Sheets

(56) References Cited

FOREIGN PATENT DOCUMENTS

WO     WO2005106139 A1 * 11/2005

OTHER PUBLICATIONS

ISOA, "Manufacturing Innovations Using IoT and Toshiba Group's Approach," TOSHIBA Review, vol. 72, No. 4, Sep. 26, 2017, pp. 39-42.
JPO, Office Action for Japanese Patent Application No. 2019-027503, dated Feb. 21, 2020, 4 pages.
JPO, Office Action (with English translation) for Japanese Patent Application No. 2019-027503, dated Jun. 16, 2020, 5 pages.

* cited by examiner

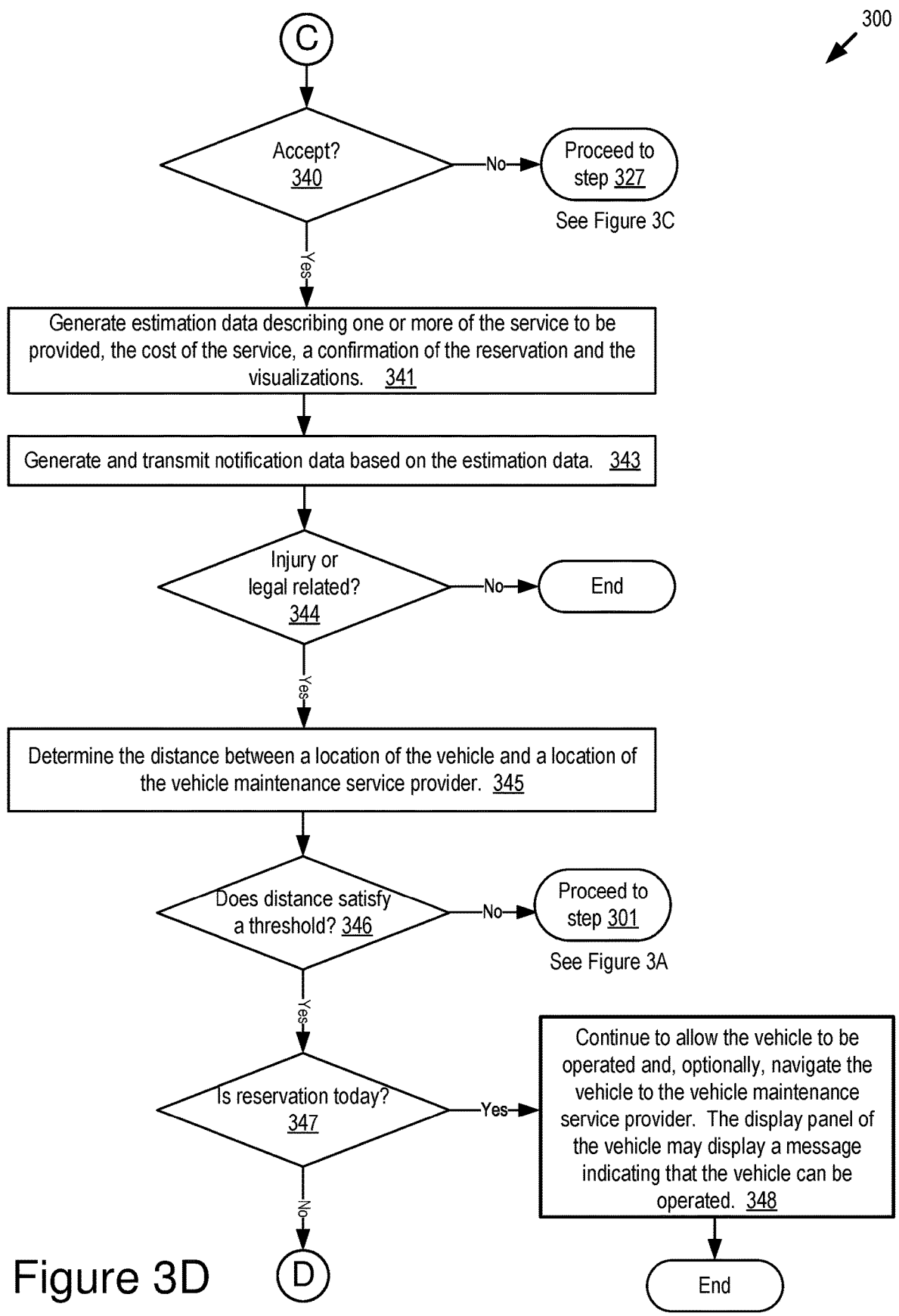

PROACTIVE VEHICLE MAINTENANCE SCHEDULING BASED ON DIGITAL TWIN SIMULATIONS

BACKGROUND

The specification relates to proactive vehicle maintenance scheduling based on one or more digital twin simulations.

A problem with modern vehicles is that vehicle owners ignore providing their vehicles with routine maintenance. For example, a vehicle provides a vehicle owner with a maintenance reminder, but the vehicle owner ignores the reminder. This behavior contributes to an increase in vehicle breakdowns on roadways. Perhaps owners ignore these maintenance reminders because the reminders themselves are conservative guesses about when a vehicle will need certain maintenance, and so the owners do not trust that they are accurate. If a reminder is inaccurate, then acting on the reminder creates a needless expense because the owner has to take their vehicle into a dealership to receive maintenance, and owners want to avoid needless expenses.

SUMMARY

Described herein are embodiments of a scheduler system that proactively schedules vehicle maintenance before breakdowns occur based on one or more digital twin simulations. In some embodiments, the scheduler system beneficially provides customers with accurate and meaningful information that they can use when determining whether to purchase a used vehicle.

In some embodiments, the scheduler system knows the state of vehicles when they are new (i.e., their "new state") based on the vehicle models for each model of one or more real-world vehicles. For example, the scheduler system is operated by a vehicle manufacturer, and so, the scheduler system has access to the vehicle models for some or all of the vehicles manufactured by the vehicle manufacturer. The vehicle model is digital data that describes all aspects of the hardware design and software design for a particular vehicle such that the vehicle can be built in the real-world based on the vehicle model (assuming that you have access to the materials and proper equipment for constructing the vehicle) or digitally simulated in a simulation based on the vehicle model. In some embodiments, the vehicle model also includes digital data that describes each of the components of the vehicle and the service life for each of these components, or information sufficient so that the service life for each component is determinable by the scheduler system based on the vehicle model.

In some embodiments, the scheduler system monitors a service life of a vehicle (or a fleet of vehicles) based on one or more of the following: (1) onboard data which is collected from the onboard sensors of the vehicle; and (2) measured data which is collected from vehicle maintenance service providers that repair the vehicle such as dealerships, repair shops and used vehicle shops. In some embodiments, new instances of the onboard data and the measured data are repeatedly received by the scheduler system over a period of time. The state of each vehicle is updated by the scheduler system based on instances of the onboard data and the measured data that are received over the period of time, thereby enabling the scheduler system to track the mechanical condition of the vehicle and whether particular parts of the vehicles will need to be replaced in the near future based on their known state and known lifecycle [as indicated by the vehicle model for the vehicle]. In some embodiments, the scheduler system provides this service for a fleet of vehicles of various makes and models, and in this way, tracks the specific mechanical condition of specific vehicles within the fleet.

The output of updating the state of the vehicle is referred to as a "digital twin." The digital twin is a digitized version of the real-world vehicle which replicates the condition of: (1) the vehicle as a whole as indicated by the onboard data and the measured data; and (2) individual components of the vehicle as indicated by the onboard data and the measured data. The scheduler system models how the vehicle will perform in the future based on the current state of the vehicle as indicated by the digital twin for that vehicle.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

One general aspect includes a method including: generating a digital twin of a vehicle; receiving digital data recorded by a sensor and describing the vehicle as it exists in a real-world and one or more historical journeys of the vehicle in the real-world; updating the digital twin of the vehicle based on the digital data describing the vehicle so that the digital twin is consistent with a condition of the vehicle as it exists in the real-world; executing a simulation based on the digital twin and the one or more historical journeys of the vehicle; estimating a component of the vehicle that fails at a future time based on the simulation; and scheduling a reservation to repair the component before the future time so that the component does not fail in the real-world. Other embodiments of this aspect include corresponding computer systems, apparatus, and computer programs recorded on one or more computer storage devices, each configured to perform the actions of the methods.

Implementations may include one or more of the following features. The method where the digital data describes a state of a set of components of the vehicle. The method where the component is selected from a group that consists of: an engine; a brake; a brake line; a fuel injector; a fuel line; a power steering unit; a transmission; a tire; a filter; a vehicle fluid; a brake pad; a brake rotor; a sensor; an onboard vehicle computer; a windshield; a battery; a windshield wiper; a windshield; an alternator; a spark plug; a sparkplug wire; a battery wire; a distributor cap; a vehicle body panel; a infotainment system component; and a powertrain component. The method where the sensor is an element of the vehicle. The method where the sensor is not an element of the vehicle. The method where the vehicle is an autonomous vehicle. The method where multiple instances of the digital data are received over time as part of a feedback loop and the digital twin is recursively updated based on the digital data received in the feedback loop. The method further including executing additional simulations responsive to receiving additional instances of digital data from the feedback loop. Implementations of the described techniques may include hardware, a method or process, or computer software on a computer-accessible medium.

One general aspect includes a system including: a non-transitory memory storing digital data recorded by a sensor and describing a vehicle as it exists in a real-world and one or more historical journeys of the vehicle in the real-world; and a processor that is communicatively coupled to the non-transitory memory, where the non-transitory memory stores computer code which, when executed by the processor, causes the processor to: generate a digital twin of a vehicle; update the digital twin of the vehicle based on the digital data describing the vehicle so that the digital twin is consistent with a condition of the vehicle as it exists in the real-world; execute a simulation based on the digital twin and the one or more historical journeys of the vehicle; estimate a component of the vehicle that fails at a future time based on the simulation; and schedule a reservation to repair the component before the future time so that the component does not fail in the real-world. Other embodiments of this aspect include corresponding computer systems, apparatus, and computer programs recorded on one or more computer storage devices, each configured to perform the actions of the methods.

Implementations may include one or more of the following features. The system where the digital data describes a state of a set of components of the vehicle. The system where the component is selected from a group that consists of: an engine; a brake; a brake line; a fuel injector; a fuel line; a power steering unit; a transmission; a tire; a filter; a vehicle fluid; a brake pad; a brake rotor; a sensor; an onboard vehicle computer; a windshield; a battery; a windshield wiper; a windshield; an alternator; a spark plug; a sparkplug wire; a battery wire; a distributor cap; a vehicle body panel; a infotainment system component; and a powertrain component. The system where the sensor is an element of the vehicle. The system where the sensor is not an element of the vehicle. The system where the vehicle is a Highly Autonomous Vehicle (HAV). The system where multiple instances of the digital data are received over time as part of a feedback loop and the digital twin is recursively updated based on the digital data received in the feedback loop. Implementations of the described techniques may include hardware, a method or process, or computer software on a computer-accessible medium.

One general aspect includes a computer program product including a non-transitory memory storing computer-executable code that, when executed by a processor, causes the processor to: generate a digital twin of a vehicle; receive digital data recorded by a sensor and describing the vehicle as it exists in a real-world and one or more historical journeys of the vehicle in the real-world; update the digital twin of the vehicle based on the digital data describing the vehicle so that the digital twin is consistent with a condition of the vehicle as it exists in the real-world; execute a simulation based on the digital twin and the one or more historical journeys of the vehicle; estimate a component of the vehicle that fails at a future time based on the simulation; and schedule a reservation to repair the component before the future time so that the component does not fail in the real-world. Other embodiments of this aspect include corresponding computer systems, apparatus, and computer programs recorded on one or more computer storage devices, each configured to perform the actions of the methods.

Implementations may include one or more of the following features. The computer program product where the digital data describes a state of a set of components of the vehicle. The computer program product where the component is selected from a group that consists of: an engine; a brake; a brake line; a fuel injector; a fuel line; a power steering unit; a transmission; a tire; a filter; a vehicle fluid; a brake pad; a brake rotor; a sensor; an onboard vehicle computer; a windshield; a battery; a windshield wiper; a windshield; an alternator; a spark plug; a sparkplug wire; a battery wire; a distributor cap; a vehicle body panel; a infotainment system component; and a powertrain component. The computer program product where the sensor is an element of the vehicle. The computer program product where the future time includes a threshold base on a distance traveled by the vehicle in the real-world. Implementations of the described techniques may include hardware, a method or process, or computer software on a computer-accessible medium.

BRIEF DESCRIPTION OF THE DRAWINGS

The disclosure is illustrated by way of example, and not by way of limitation in the figures of the accompanying drawings in which like reference numerals are used to refer to similar elements.

FIGS. 3A-3E includes a flowchart of an example method for providing a scheduler service for a real-world vehicle according to some embodiments.

DETAILED DESCRIPTION

Figure 1A:
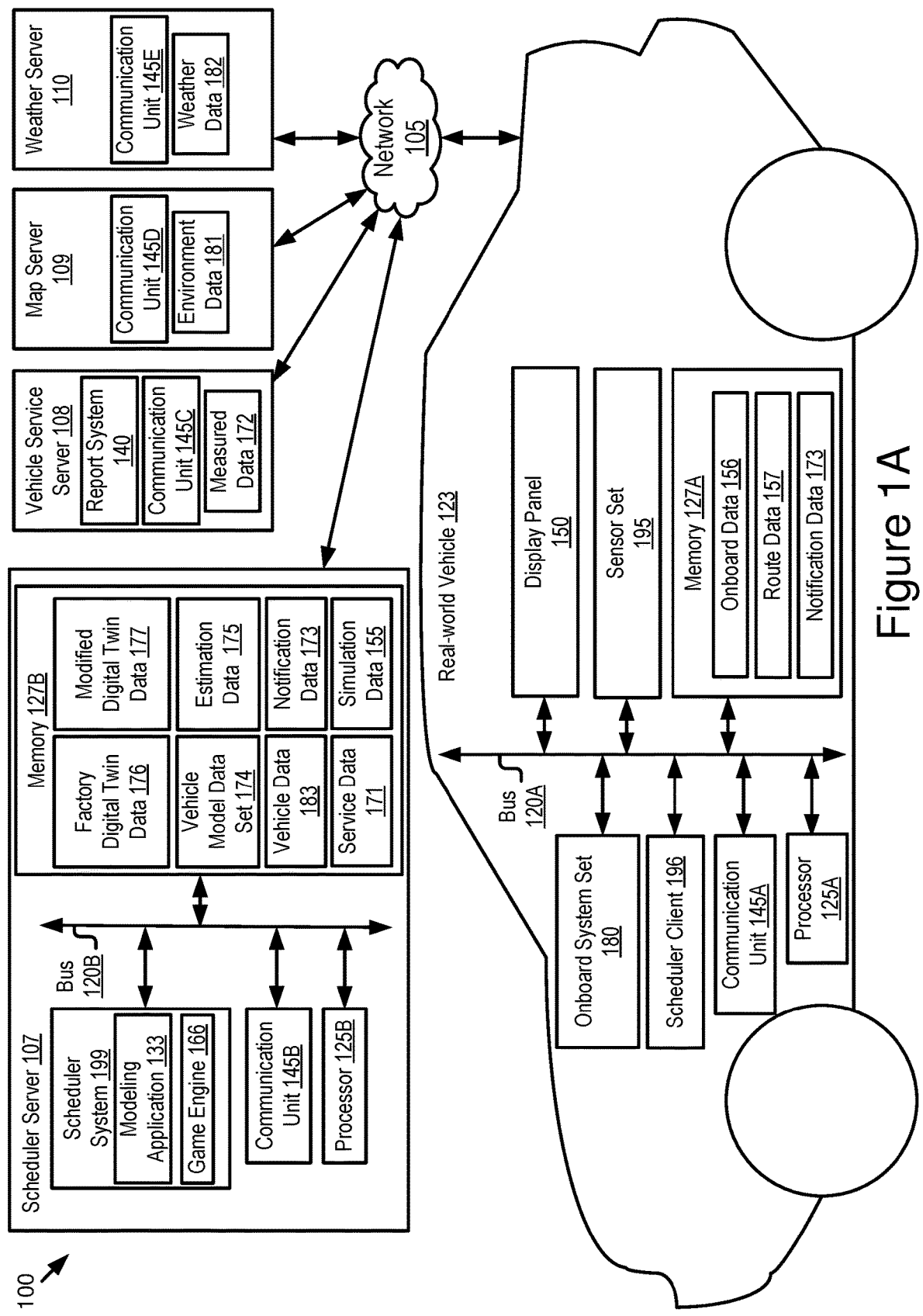
FIG. 1A is a block diagram illustrating an operating environment for a scheduler system according to some embodiments.

A problem with modern vehicles is that vehicle owners ignore providing their vehicles with routine maintenance. For example, their vehicle provides them with a maintenance reminder, but they ignore it. This behavior contributes to an increase in vehicle breakdowns on roadways. For example, a non-profit corporation that assists motorists with roadside breakdowns rescued a record-breaking 32 million drivers in 2015 whose vehicles suffered a breakdown on the roadway.

There are many hypotheses about why owners ignore their vehicle maintenance reminders. For example, perhaps owners ignore these maintenance reminders because they are merely guesses about when a vehicle will need certain maintenance, and so the owners do not trust that they are accurate. If these maintenance reminders are inaccurate, or if drivers simply think that they are inaccurate, then it is a needless expense to take their vehicle into a dealership to receive maintenance, and the owners want to avoid this needless expense.

However, there are ways to make vehicle maintenance reminders more accurate and to increase owner confidence in their accuracy. New vehicles sold in the United States will have to be equipped with onboard wireless communication devices in the near future. In some embodiments, a scheduler system uses one or more of these onboard wireless communication devices to collect information about vehicles which is then used to run digital simulations (herein, "simulations") which accurately predict when vehicles will need vehicle maintenance so that they receive proactive vehicle maintenance before a breakdown event occurs, e.g., due to a failed vehicle component.

Described herein are embodiments of a scheduler system. In some embodiments, the scheduler system beneficially provides a vehicle with a scheduling service that is operable to proactively schedule maintenance for a vehicle before a breakdown event occurs for the vehicle. In other words, embodiments of the scheduler system provide proactive vehicle maintenance scheduling. In some embodiments, the scheduler system provides proactive vehicle maintenance scheduling based on digital twin simulations. These digital twin simulations provide accurate and personalized information about when a vehicle should receive maintenance, and so, owners should be more likely to trust the information provided by the scheduler system relative to existing solutions.

In some embodiments, the scheduler system described herein overcomes the deficiencies of the existing solutions by causing a processor to execute one or more of the following steps when executed by the processor: generating a simulated version of in its "new state" based on vehicle model for that vehicle; aggregating onboard data and measured data that describe changes in the state of the vehicle; updating the vehicle model of the vehicle based on the onboard data and the measured data to generate a modified vehicle model of the vehicle that accurately represents the vehicle as it exists in the real-world in its "modified state" (this updated vehicle model is referred to herein as a "modified vehicle model"); generating a digital twin based on the modified vehicle model that accurately represents the vehicle in its modified state; receiving route data that includes digital data that describes one or more of the vehicle's real-life journeys, actual driving routes, roadway environment and weather conditions during these journeys; executing one or more digital simulations that include the digital twin operating in simulated conditions that are the same as or similar to those described by the route data (these simulations may be periodically or continually re-executed based on the receipt of one or more of the following: new onboard data; new measured data; and new route data); estimating, based on the simulations, one or more components of the vehicle that will fail at an interval that satisfies a threshold; and proactively scheduling a maintenance event to repair or replace the one or more components before the interval satisfies the threshold in the real-world so that a breakdown event does not occur in the real-world based on a failure of the one or more components. One or more of these steps may be included in the scheduling service provided by the scheduler system.

In some embodiments, the scheduler system applies one or more thresholds when estimating whether one or more components of the vehicle will fail based on the simulations executed by the scheduling service. Suitable examples of a threshold include the following: a component will fail if the vehicle travels more than half a mile in the real-world; a component will fail if the vehicle travels more than five miles in the real-world; a component will fail if the vehicle travels more than 10 miles in the real-world; any other threshold based on a distance traveled by the vehicle; a component will fail if more than half a day elapses in the real-world relative to the current time in the real-world; a component will fail if more than five days elapse in the real-world relative to the current time in the real-world; a component will fail if more than 30 days elapse in the real-world relative to the current e in the real-world; any other threshold based on a time elapsed; a component will fail if the vehicle engine's rotations per minute (RPM) satisfies some threshold (optionally, for a certain amount of time); a component will fail if the vehicle's oil pressure satisfies some threshold (optionally, for a certain amount of time); and any other threshold relative to a vehicle component's life cycle. In some embodiments, this threshold is referred to as a "future time" to refer to some event that occurs in the future and is estimated by the scheduler system to result in a failure of one or more components of the vehicle.

In some embodiments, a collision is a type of interval if the collision causes a failure of a vehicle component.

In some embodiments, the onboard data and measured data may be received on a periodic or continual basis. In some embodiments, the onboard data and measured data generally describe depreciation in the state of the vehicle, but in practice the state may periodically increase, e.g., if a new component is installed or when vehicle maintenance is performed.

In some embodiments, the vehicle model is updated on a periodic or continual basis responsive to the receipt of instances of onboard data and measured data over time.

In some embodiments, the vehicle model data is design data that describes the vehicle design models, Computer-aided Design (CAD) data for the vehicle design, simulation/test results for each model of vehicle, etc. Based on the design data, the scheduler system knows the state of vehicles when they are new (i.e., their "new state").

In some embodiments, a vehicle includes a scheduler client which is executed by an electronic control unit (ECU) of the vehicle. The vehicle includes onboard systems and the onboard sensors which monitor the condition of the vehicle and its components, and track for the occurrence of significant traffic events such as traffic accidents. For example, the onboard systems of the vehicle include one or more Advanced Driver Assistance Systems (ADAS systems) which monitor for and seek to avoid traffic accidents, and generate digital data describing when such events/accidents occur. Examples of ADAS systems are described below.

Onboard Data

In some embodiments, a communication unit of the vehicle receives onboard data via the in-vehicle network which communicatively couples the communication unit to the onboard systems and the onboard sensors of the vehicle. The onboard data is digital data that includes: (1) the sensor data that describes the measurements recorded by the vehicle's onboard sensors, system status indicators and user inputs; and (2) the ADAS data that describes the events/accidents detected by the vehicle's ADAS systems as well as vehicle dynamics information measured by the ADAS systems.

Considered individually or combined, the sensor data and ADAS data describe events that appreciate or depreciate the state vehicle. For example, if a component in the vehicle is replaced for a new or upgraded version, the state of the vehicle is appreciated because the component is new or upgraded. This is detected, for example, by the ECU which controls the component and detects a new device communicating with the in-vehicle network and the ECU may generate sensor data that describes this event. If the vehicle is involved in an accident, then this depreciates the state of the vehicle and the ADAS data describes the accident.

In some embodiments, the onboard data includes digital data that describes the driver's real-life approach to driving the real-world vehicle as recorded by the onboard sensors of the vehicle and the ADAS systems of the vehicle. For example, the onboard data describes one or more of the following: a speed of accelerator pedal operation; quantity of brake pedal operation; a timing of steering operation; and an overall aggressiveness or timidity of the driver while operating the vehicle.

Scheduler Client

In some embodiments, the scheduler client is software executed by an ECU of the vehicle. The scheduler client communicates with the communication unit of the vehicle to aggregate and timestamp the onboard data. The scheduler client then reports the onboard data back to the scheduler system which is stored on and executed by a server that is communicatively coupled to a wireless network. For example, the scheduler client causes the communication unit of the vehicle to transmit aggregated and timestamped sets of the onboard data back to the scheduler system (which operates on a cloud server) at regular intervals via Wi-Fi™, 3G, 4G, Long-term Evolution (LTE), 5G, Direct Short-Range Communication (DSRC) or some other form of wireless communication. In another embodiment, the onboard data is reported back to the scheduler system when the vehicle goes to a dealership for servicing (e.g., at each oil change).

Accordingly, the onboard data is a first source of digital data for the scheduler system that describes the appreciation and depreciation of the of the vehicle.

In some embodiments, the vehicle is taken to a vehicle maintenance service provider (e.g., a dealership, repair shop, used vehicle shop, etc.) from time to time for servicing. In many instances, these service events are detected by the onboard systems of the vehicle and described by the onboard data. However, an optional feature according to some embodiments is the ability to capture these service events via electronic reports that are sent are sent by a report system which is provided to the dealerships, repair shops and used vehicle shops.

For example, these dealerships, repair shops and used vehicle shops include servers that are communicatively coupled to a network. Measured data is digital data that describes the service events that occur at these dealerships, repair shops and used vehicle shops. The servers include a report system. The report system is software installed in the servers of these dealerships, repair shops and used vehicle shops. The report system reports the measured data back to the scheduler system so that the measured data can be included in the analysis and functionality provided by the scheduler system.

Accordingly, the measured data is a second source of digital data for the scheduler system that describes the appreciation and depreciation of the vehicle, where the onboard data is the first source of such digital data.

The report system and the measured data are optional features of some embodiments described herein.

Scheduler System

In some embodiments, the scheduler system includes software that is stored on a cloud server (or some other hardware server). The cloud server includes a processor. The scheduler system includes code and routines that are operable to generate a digital twin of a particular real-world vehicle. In some embodiments, the scheduler system uses this digital twin to generate simulations based on one or more of the following: the real-world vehicle's real-life journeys, expected future journeys, actual driving routes, actual mechanical condition, real-life weather conditions and forecasted weather conditions; and the driver's real-life approach to driving the real-world vehicle (e.g., speed of accelerator pedal operation, quantity of brake pedal operation, timing of steering operation, overall aggressiveness or timidity). The driver's real-life approach to driving the real-world vehicle is described by the onboard data.

Based on these simulations, the scheduler system estimates future maintenance events. Example maintenance events include one or more of the following: change engine oil; change/check engine coolant; change/check braking system (brake fluid, brake pads, rotors, etc.); change/check power steering fluid; change air filter; change fuel filter, change cabin air filter; check engine belts; change/rotate tires; tire alignment; balance tires; check battery fluid and clean contacts; and check/change spark plugs, spark plug wires, distributor cap, etc. In some embodiments, the scheduler system includes code and routines that are operable to proactively schedule maintenance appointments for the real-world vehicle so that, if the appointments are kept, the vehicle continues to operate in accordance with its design specification. Some embodiments, the scheduler system also generates and provides in-vehicle notifications to the driver of the maintenance event and scheduled maintenance.

In some embodiments, the scheduler system includes software stored on a non-transitory memory. The non-transitory memory is an element of a processor-based computing device such as the cloud server. The scheduler system includes code and routines that are operable, when executed by a processor of the computing device, to cause the processor to provide a scheduling service by executing one or more of the following steps: generating a simulated version of the a vehicle in its new state based on vehicle model for that vehicle; aggregating onboard data and s ed data that describe changes in the state of the vehicle; updating the vehicle model of the vehicle based on the onboard data and the measured data to generate a modified vehicle model of the vehicle that accurately represents the vehicle as it exists in the real-world in its modified state; generating a digital twin based on the modified vehicle model that accurately represents the vehicle in its modified state; receiving route data that includes digital data that describes one or more of the vehicle's real-life journeys, actual driving routes, roadway environment and weather conditions during these journeys; executing one or more digital simulations that include the digital twin operating in simulated conditions that are the same as or similar to those described by the route data; estimating, based on the simulations, one or more components of the vehicle that will fail at an interval that satisfies a threshold; and proactively scheduling a maintenance event to repair or replace the one or more components before the interval satisfies the threshold in the real-world so that a breakdown vent does not occur in the real-world based on a failure of the one or more components.

In some embodiments, the scheduler system includes a game engine for generating the digital twins of the vehicle in various modified states. For example, the scheduler system uses the vehicle model for a particular vehicle (based on the vehicle's particular make and model, e.g., 2017 Toyota Camry) to generate a simulated version of the particular vehicle.

The vehicle model includes any digital data and information that is necessary for the game engine to generate a digital twin of a real-world vehicle. The digital twin is a digitally simulated version of the real-world vehicle that is outputted by the game engine based on the vehicle model for the real-word vehicle and any onboard data and measured data that is received for the real-word vehicle from the scheduler client of the real-world vehicle. In some embodiments, the vehicle model is based on design data for the real-world vehicle whose digital twin is created using the vehicle model. In some embodiments, the scheduler system includes a modeling application that is operable to generate the vehicle model for a particular vehicle based in part on the design data and, optionally, any onboard data and measured data that are received for a vehicle that is being monitored by the scheduler system.

Figure 1B:
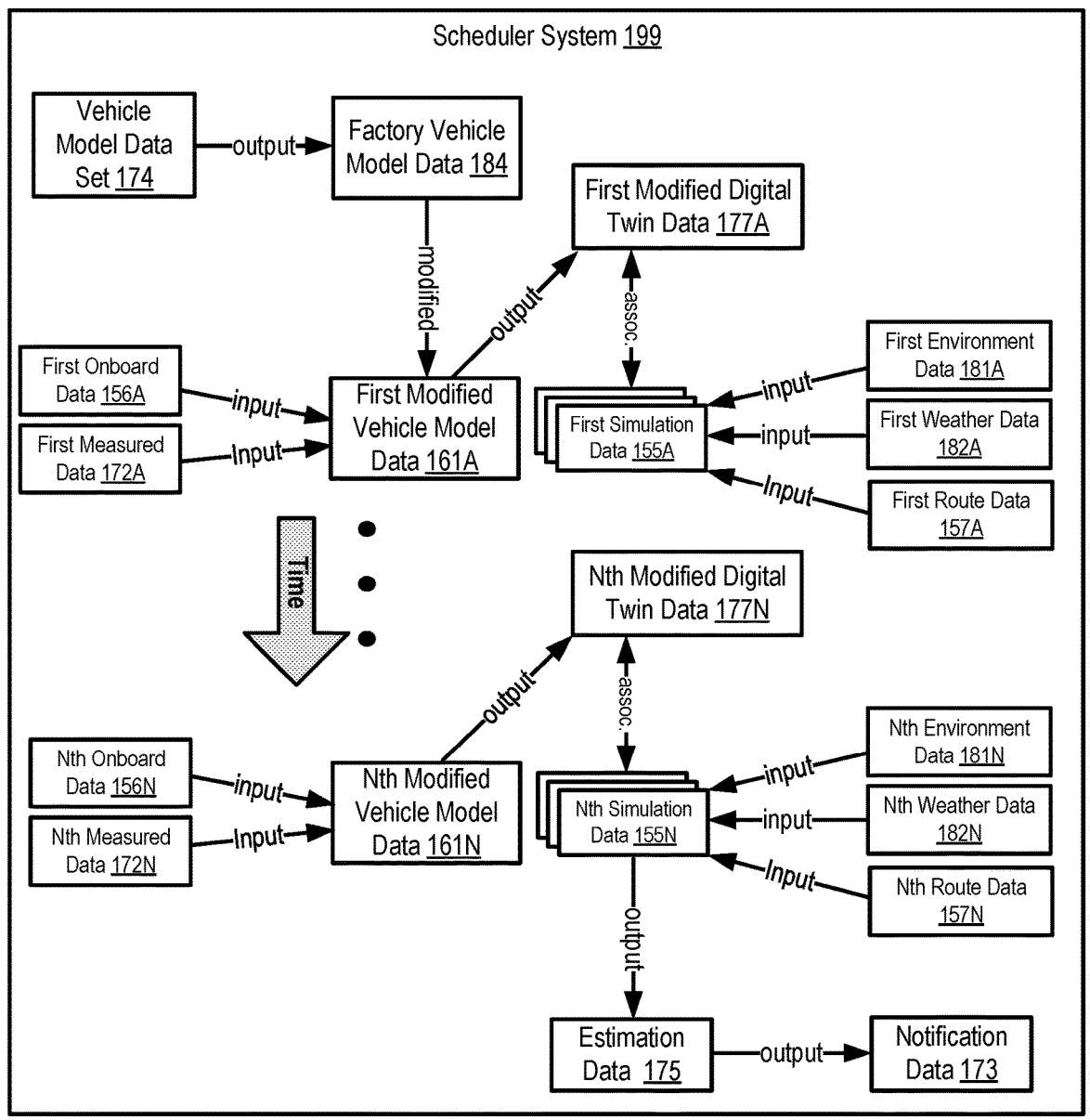
FIG. 1B is a block diagram illustrating a process flow for a scheduler system to provide a schedule service according to some embodiments.

Initially, the vehicle model is referred to as "factory vehicle model" since it represents the version of the vehicle as it was manufactured, i.e., without any depreciation (see, e.g., element 184 of FIG. 1B). Over the life of a particular vehicle, the scheduler system receives reports of onboard data and measured data for this particular vehicle. The scheduler system modifies particular parameters of the vehicle model for this particular vehicle based on the depreciation/appreciation information included in the onboard data and the measured data. These modifications may occur on a periodic or recurring basis as the depreciation/appreciation information is received.

For example, if the onboard data indicates that the vehicle now has 100,000 miles on the odometer, then the scheduler system modifies the vehicle model to reflect this depreciation for the engine, radiator, transmission, etc. for the vehicle. A vehicle model which reflects the depreciation and appreciation for a vehicle which occurs over time is referred to as the "modified vehicle model" (see, e.g., elements 161A and 161N of FIG. 1B). No other vehicle model uses onboard data and measured data to generate a digital twin of a real-world vehicle which accurately reflects the mechanical condition of a used vehicle and whether particular parts of the vehicle will need to be replaced in the near future.

The modeling application includes any Modelica-based modeling application. The modeling application may include CarSim (distributed by Mechanical Simulation Corporation or Ann Arbor, Mich.), MapleSim (distributed by Maplesoft of Waterloo, Ontario) or any other Modelica-based modeling application.

The game engine may be a Unity-based game engine (such as the Unity game engine distributed by Unity Technology of San Francisco, Calif.), or any other game engine operable, when executed by a processor, to generate a digital simulation (herein "simulation") for testing and monitoring the operation of a virtual vehicle that represents a real-world vehicle that exists in the real-world.

The modeling application includes code and routines that are operable, when executed by a processor, to generate vehicle model data that describes a vehicle model of a vehicle (see, e.g., elements 160, 161A and 161N of FIG. 1B). The vehicle model data includes data necessary to cause the game engine to generate a virtualized version of the real-world vehicle.

Estimation Data

The scheduler system includes code and routines that are operable to receive the modified vehicle model data as an input and then perform one or more simulations (e.g., hundreds or thousands of simulations) which estimate one or more of the following: (1) whether particular components of the real-world version of the vehicle will need to be repaired or replaced in the future; and (2) an interval of time, vehicle mileage or some of unit of measurement before the particular components will need to be repaired or replaced. The scheduler system includes code and routines that are operable to proactively schedule one or more maintenance appointments to perform the repairs or replacements before a breakdown occurs, receive a cost estimate and reservation confirmation for the one or more maintenance appointments and generate one or more graphical visualizations that describe this information for the driver of the vehicle. The estimation data is digital data that describes the future maintenance needs of the vehicle (e.g., via the one or more graphical visualizations), the scheduled maintenance appointments and the costs for these maintenance appointments. The scheduler system generates notification data based on the estimation data.

Notification Data

The notification data is digital data that will cause the electronic display of the vehicle to display information that informs the driver about the estimation data. Optionally, the scheduler client may take steps to ensure that the vehicle receives the scheduled maintenance such as pinging the driver with reminders, displaying the mileage remaining until the next scheduled maintenance appointment and, in only cases where operating the vehicle would be life threatening or illegal, causing the vehicle to become inoperative.

ADAS System

Examples of an ADAS system may include one or more of the following elements of an real-world vehicle: an adaptive cruise control (ACC) system; a lane keeping assistant system (LKA); an adaptive high beam system; an adaptive light control system; an automatic parking system; an automotive night vision system; a blind spot monitor; a collision avoidance system; a crosswind stabilization system; a driver drowsiness detection system; a driver monitoring system; an emergency driver assistance system; a forward collision warning system; an intersection assistance system; an intelligent speed adaption system; a lane departure warning system; a pedestrian protection system; a traffic sign recognition system; a turning assistant; and a wrong-way driving warning system.

The ADAS system may also include any software or hardware included in a real-world vehicle that makes that vehicle be an autonomous vehicle or a semi-autonomous vehicle.

In some embodiments, the ADAS system may be a vehicular system that is operable to perform or control the performance of one or more of the following vehicle functions: the steering of the vehicle; the braking of the vehicle; the acceleration of the vehicle; the operation of a transmission of the vehicle; and how aggressive or passive (e.g., fast or slow, respectively) the transmission changes one or more gears of the transmission. In this way, the ADAS system modifies the operation of an autonomous or semi-autonomous vehicle.

In some embodiments, the ADAS system may be a vehicular system that is operable to perform or control the performance of one or more of the following vehicle functions: how easily a steering wheel of the vehicle is turned by a driver of the vehicle; how much resistance the steering wheel provides to the driver when the driver attempts to turn the steering wheel; how readily a braking system of the vehicle decelerates or stops the vehicle when the driver depresses a braking pedal of the vehicle; how readily the engine of the vehicle accelerates when the driver of the vehicle depresses an accelerator of the vehicle; how aggressive or passive (e.g., fast or slow, respectively) the transmission changes one or more gears of the transmission when the driver of the vehicle provides an input that is operable to affect how or when the transmission changes the one or more gears of the transmission; and how sluggish an engine of the vehicle performs when the driver provides an input that is operable to affect the operation of the engine. In this way, an ADAS system of the vehicle is operable to affect the performance or operation of one or more vehicle components (or their apparent performance as viewed from the perspective of the driver of the vehicle), including, for example: a power steering pump of the vehicle; a braking system of the vehicle; a fuel line of the vehicle; a fuel injector of the vehicle; a transmission of the vehicle; and an engine of the vehicle.

System Overview

Referring to FIG. 1A, depicted is an operating environment 100 for a scheduler system 199 according to some embodiments. The operating environment 100 as depicted includes a real-world vehicle 123 (herein "vehicle 123" if singular, or "vehicles 123" if plural), a scheduler server 107, a vehicle service server 108, a map server 109 and a weather server 110. These elements may be communicatively coupled to one another via a network 105. Although one vehicle 123, one scheduler server 107, one vehicle service server 108, one map server 109, one weather server 110 and one network 105 are depicted in FIG. 1A, in practice the operating environment 100 may include one or more vehicles 123, one or more scheduler servers 107, one or more vehicle service servers 108, one or more map servers 109, one or more weather servers 110 or one or more networks 105.

The network 105 may be a conventional type, wired or wireless, and may have numerous different configurations including a star configuration, token ring configuration, or other configurations. Furthermore, the network 105 may include a local area network (LAN), a wide area network (WAN) (e.g., the Internet), or other interconnected data paths across which multiple devices and/or entities may communicate. In some embodiments, the network 105 may include a peer-to-peer network. The network 105 may also be coupled to or may include portions of a telecommunications network for sending data in a variety of different communication protocols. In some embodiments, the network 105 includes Bluetooth® communication networks or a cellular communications network for sending and receiving data including via short messaging service (SMS), multimedia messaging service (MMS), hypertext transfer protocol (HTTP), direct data connection, wireless application protocol (WAP), e-mail, DSRC, full-duplex wireless communication, etc. The network 105 may also include a mobile data network that may include 3G, 4G, LTE, LTE-V2X, VoLTE or any other mobile data network or combination of mobile data networks. Further, the network 105 may include one or more IEEE 802.11 wireless networks.

The network 105 may include one or more communication channels shared among the vehicle 123 and the scheduler server 107. The communication channel may include DSRC, LTE-V2X, full-duplex wireless communication or any other wireless communication protocol. For example, the network 105 may be used to transmit a DSRC message, a DSRC probe, a Basic Safety Message (BSM) or a full-duplex message including any of the data described herein.

The vehicle 123 is any type of connected vehicle. For example, the vehicle 123 is one of the following types of vehicles: a car; a truck; a sports utility vehicle; a bus; a semi-truck; a drone or any other roadway-based conveyance.

In some embodiments, the vehicle 123 is an autonomous vehicle or a semi-autonomous vehicle. For example, the vehicle 123 includes an onboard system set 180. The onboard system set 180 includes a set of ADAS systems. The set of ADAS systems provide sufficient autonomous features to the vehicle 123 to render the vehicle 123 an autonomous vehicle. The National Highway Traffic Safety Administration (NHTSA) has defined different "levels" of autonomous vehicles, e.g., Level 0, Level 1, Level 2, Level 3, Level 4 and Level 5. If a vehicle 123 has a higher-level number than another vehicle 123 (e.g., Level 3 is a higher-level number than Levels 2 or 1), then the vehicle 123 with a higher-level number offers a greater combination and quantity of autonomous features relative to the vehicle 123 with the lower level number. The different levels of autonomous vehicles are described briefly below.

Level 0: The set of ADAS systems installed in the vehicle 123 have no vehicle control but may issue warnings to the driver of the vehicle 123.

Level 1: The driver must be ready to take control of the vehicle 123 at any time. The set of ADAS systems installed in the vehicle 123 may provide autonomous features such as one or more of the following: an ACC; and Parking Assistance with automated steering and LKA Type II, in any combination.

Level 2: The driver is obliged to detect objects and events in the roadway environment and respond if the set of ADAS systems installed in the vehicle 123 fail to respond properly (based on the driver's subjective judgement). The set of ADAS systems installed in the vehicle 123 executes accelerating, braking, and steering. The set of ADAS systems installed in the vehicle 123 can deactivate immediately upon takeover by the driver.

Level 3: Within known, limited environments (such as freeways), the driver can safely turn their attention away from driving tasks but must still be prepared to take control of the vehicle 123 when needed.

Level 4: The set of ADAS systems installed in the vehicle 123 can control the vehicle 123 in all but a few environments such as severe weather. The driver must enable the automated system (which is comprised of the set of ADAS systems installed in the vehicle 123) only when it is safe to do so. When the automated system is enabled, driver attention is not required for the vehicle 123 to operate safely and consistent with accepted norms.

Level 5: Other than setting the destination and starting the system, no human intervention is required. The automated system can drive to any location where it is legal to drive and make its own decision (which may vary based on the jurisdiction where the vehicle 123 is located).

In some embodiments, the vehicle 123 is a Highly Autonomous Vehicle ("HAV" if singular, or "HAVs" if plural). An HAV is a vehicle 123 (e.g., the DSRC-enabled ego vehicle) that includes a set of ADAS systems that operate at Level 3 or higher as described and above, or as defined by the NHTSA on page 9 of their policy paper entitled "Federal Automated Vehicles Policy: Accelerating the Next Revolution in Roadway Safety," which was published in September of 2016.

In some embodiments, the vehicle 123 includes one or more of the following elements: a processor 125A; a memory 127A; a communication unit 145A; an onboard system set 180; a sensor set 195; and a scheduler client 196. These elements of the vehicle 123 are communicatively coupled to one another via a bus 120A. Although only one of each of these elements are depicted in FIG. 1A, in practice the vehicle 123 may include one or more processors 125A, one or more memories 127A, one or more communication units 145A, one or more onboard system sets 180, one or more sensor sets 195 and one or more scheduler clients 196.

The scheduler server 107 is a processor-based computing device. For example, the scheduler server 107 may include one or more of the following types of processor-based computing devices: a personal computer; a laptop; a mainframe; or any other processor-based computing device that is operable to function as a server. The scheduler server 107 may include a hardware server.

In some embodiments, the scheduler server 107 includes one or more of the following elements: a processor 125B; a memory 127B; a communication unit 145B; and a scheduler system 199. These elements of the scheduler server 107 are communicatively coupled to one another via a bus 120B.

The processor 125A of the vehicle 123 and the processor 125B of the scheduler server 107 may be referred to herein collectively or individually as the "processor 125" since, for example, the processor 125A of the vehicle 123 provides similar functionality to the components of the vehicle 123 as does the processor 125B of the scheduler server 107. For similar reasons, the description provided herein uses the following terms when referring to elements that are common to the vehicle 123 and the scheduler server 107: the "memory 127" when referring to the memory 127A and the memory 127B, collectively or individually; and the "communication unit 145" when referring to the communication unit 145A, the communication unit 145B, the communication unit 145C, the communication unit 145D and the communication unit 145E, collectively or individually.

The vehicle 123 and the scheduler server 107 are now described.

Vehicle 123

In some embodiments, the processor 125 and the memory 127 may be elements of an onboard vehicle computer system. The onboard vehicle computer system may be operable to cause or control the operation of one or more of the following elements: one or more ADAS systems included in the onboard system set 180; the sensor set 195; the communication unit 145; the processor 125; and the memory 127; and the scheduler client 196. The onboard vehicle computer system may be operable to access and execute the data stored on the memory 127 to provide the functionality described herein for the scheduler client 196. The onboard vehicle computer system may be operable execute the scheduler client 196 which causes the onboard vehicle computer system to execute one or more of the steps of the method 300 described below with reference to FIGS. 3A-3E.

The onboard system set 180 includes one or more ADAS systems. The ADAS systems provide one or more autonomous features to the vehicle 123. In some embodiments, the vehicle 123 is an autonomous vehicle, a semi-autonomous vehicle, or an HAV. For example, the vehicle 123 includes a set of ADAS systems that provide autonomous features to the vehicle 123, which are sufficient to render the vehicle 123 an autonomous vehicle.

The ADAS systems may include one or more of the following elements: an ACC system; an adaptive high beam system; an adaptive light control system; an automatic parking system; an automotive night vision system; a blind spot monitor; a collision avoidance system; a crosswind stabilization system; a driver drowsiness detection system; a driver monitoring system; an emergency driver assistance system; a forward collision warning system; an intersection assistance system; an intelligent speed adaption system; a lane departure warning system (also referred to as a lane keep assistant); a pedestrian protection system; a traffic sign recognition system; a turning assistant; a wrong-way driving warning system; autopilot; sign recognition; and sign assist. Each of these example ADAS systems provide their own features and functionality that may be referred to herein as an "ADAS feature" or "ADAS functionality," respectively. The features and functionality provided by these example ADAS systems are also referred to herein as an "autonomous feature" or an "autonomous functionality," respectively.

The vehicle 123 may be operated by a driver. For example, if the vehicle 123 is an autonomous vehicle that is Level 3 or lower, then the vehicle 123 may be operated by a driver. In some embodiments, the ADAS systems of the vehicle 123 are operable to monitor and record the driver's real-life approach to driving the vehicle 123 (e.g., speed of accelerator pedal operation, quantity of brake pedal operation, timing of steering operation, overall aggressiveness or timidity, etc.). In some embodiments, the onboard data 156 includes digital data that describe the recordings of the driver's real-life approach to driving the vehicle 123.

The sensor set 195 includes any onboard sensors of the vehicle 123 which monitor the roadway environment of the vehicle 123, whether internally or externally. In some embodiments, the sensor set 195 may include any sensors in the vehicle 123 that generate sensor data during a journey. In some embodiments, the sensor set 195 of the vehicle 123 may include one or more of the following vehicle sensors: a vibrometer; a collision detection system; an engine oil pressure detection sensor; a camera (e.g., one or more of an internal camera and an external camera); a LIDAR sensor; an ultrasonic sensor; a radar sensor; a laser altimeter; an infrared detector; a motion detector; a thermostat; a sound detector, a carbon monoxide sensor; a carbon dioxide sensor; an oxygen sensor; a mass air flow sensor; an engine coolant temperature sensor; a throttle position sensor; a crank shaft position sensor; an automobile engine sensor; a valve timer; an air-fuel ratio meter; a blind spot meter; a curb feeler; a defect detector; a Hall effect sensor, a manifold absolute pressure sensor; a parking sensor; a radar gun; a speedometer; a speed sensor; a tire-pressure monitoring sensor; a torque sensor; a transmission fluid temperature sensor; a turbine speed sensor (TSS); a variable reluctance sensor; a vehicle speed sensor (VSS); a water sensor; a wheel speed sensor; and any other type of automotive sensor. The scheduler client 196 incorporates the sensor data generated by these onboard sensors into the onboard data 156 stored in the memory 127.

In some embodiments, the sensors included in the sensor set 195 record digital data that describes an actual mechanical condition of the vehicle 123 as measured by one or more of these sensors. In some embodiments, the onboard data 156 is digital data that describes the sensor measurements that describe the actual mechanical condition of the vehicle 123.

The communication unit 145 transmits and receives data to and from a network 105 or to another communication channel. In some embodiments, the communication unit 145 may include a DSRC transceiver, a DSRC receiver and other hardware or software necessary to make the vehicle 123 (or some other device such as the scheduler server 107) a DSRC-enabled device.

In some embodiments, the communication unit 145 includes a port for direct physical connection to the network 105 or to another communication channel. For example, the communication unit 145 includes a USB, SD, CAT-5, or similar port for wired communication with the network 105. In some embodiments, the communication unit 145 includes a wireless transceiver for exchanging data with the network 105 or other communication channels using one or more wireless communication methods, including: IEEE 802.11; IEEE 802.16, BLUETOOTH®; EN ISO 14906:2004 Electronic Fee Collection—Application interface EN 11253: 2004 Dedicated Short-Range Communication—Physical layer using microwave at 5.8 GHz (review); EN 12795:2002 Dedicated Short-Range Communication (DSRC)—DSRC Data link layer: Medium Access and Logical Link Control (review); EN 12834:2002 Dedicated Short-Range Communication—Application layer (review); EN 13372:2004 Dedicated Short-Range Communication (DSRC)—DSRC profiles for RTTT applications (review); the communication method described in U.S. patent application Ser. No. 14/471,387 filed on Aug. 28, 2014 and entitled "Full-Duplex Coordination System"; or another suitable wireless communication method.

In some embodiments, the communication unit 145 includes a full-duplex coordination system as described in U.S. patent application Ser. No. 14/471,387 filed on Aug. 28, 2014 and entitled "Full-Duplex Coordination System."

In some embodiments, the communication unit 145 includes a cellular communications transceiver for sending and receiving data over a cellular communications network including via short messaging service (SMS), multimedia messaging service (MMS), hypertext transfer protocol (HTTP), direct data connection, WAP, e-mail, or another suitable type of electronic communication. In some embodiments, the communication unit 145 includes a wired port and a wireless transceiver. The communication unit 145 also provides other conventional connections to the network 105 for distribution of files or media objects using standard network protocols including TCP/IP, HTTP, HTTPS, and SMTP, millimeter wave, DSRC, etc.

The processor 125 includes an arithmetic logic unit, a microprocessor, a general-purpose controller, or some other processor array to perform computations and provide electronic display signals to a display device. The processor 125 processes data signals and may include various computing architectures including a complex instruction set computer (CISC) architecture, a reduced instruction set computer (RISC) architecture, or an architecture implementing a combination of instruction sets. The vehicle 123 may include one or more processors 125. Other processors, operating systems, sensors, displays, and physical configurations may be possible.

The memory 127 stores instructions or data that may accessed and executed by the processor 125. The instructions or data may include code for performing the techniques described herein. The memory 127 may be a dynamic random-access memory (DRAM) device, a static random-access memory (SRAM) device, flash memory, or some other memory device. In some embodiments, the memory 127 also includes a non-volatile memory or similar permanent storage device and media including a hard disk drive, a floppy disk drive, a CD-ROM device, a DVD-ROM device, a DVD-RAM device, a DVD-RW device, a flash memory device, or some other mass storage device for storing information on a more permanent basis. A portion of the memory 127 may be reserved for use as a buffer or virtual random-access memory (virtual RAM). In some embodiments, one or more of the vehicle 123 and the scheduler server 107 include two or more memories 127.

In some embodiments, the memory 127 of the vehicle 123 stores one or more of the following types of digital data: the onboard data 156; route data 157; and notification data 173.

The onboard data 156 includes digital data that describes (1) the actual mechanical condition of the vehicle 123 as measured by one or more of the sensors of the sensor set 195 and the ADAS systems of the onboard system set 180 and (2) the driver's real-life approach to driving the vehicle 123 (e.g., speed of accelerator pedal operation, quantity of brake pedal operation, timing of steering operation, overall aggressiveness or timidity).

In some embodiments, the onboard data 156 includes digital data that that includes one or more of the following: (1) sensor data that is digital data that describes the measurements recorded by the vehicle's onboard sensors which are included in the sensor set 195, system status indicators and user inputs; and (2) ADAS data that is digital data that describes the events/accidents detected by the vehicle's ADAS systems as well as vehicle dynamics information measured by the ADAS systems. In some embodiments, the onboard system set 180 includes one or more ADAS systems.

The route data 157 is digital data that describes one or more historical real-life journeys of the vehicle 123, actual driving routes of the vehicle 123 and weather conditions during the one or more historical real-life journeys. The route data 157 is analyzable to determine, based on historical information included in the route data 157, future events such as future journeys of the vehicle 123, the exact routes to be used for these future journeys and forecasts for the weather to be experienced on these future journeys. In some embodiments, the scheduler system 199 of the scheduler server 107 includes code and routines that are operable, when executed by the processor 125 of the scheduler server 107, to cause the processor 125 to analyze the route data 157 and determine these future events.

The notification data 173 is generated by the scheduler system 199 and transmitted to the vehicle 123 via the network 105. The notification data 173 is described below with reference to the scheduler system 199.

The display panel 150 is an electronic display panel that is operable to display graphical visualizations or other visual information. For example, the display panel is an electronic screen or an electronic touch screen of a head unit of the vehicle 123, a heads-up display unit or some other electronic device that is operable to display visual information for viewing by the driver of the vehicle 123. In some embodiments, the display panel 150 is an element of a processor-based computing device such as a smartphone, tablet computer, smartwatch or some other processor-based computing device that is operable to send and receive wireless messages via the network 105.

The scheduler client 196 includes code or routines that, when executed by the processor 125, causes the onboard data 156 to be recorded and causes the communication unit 145 to transmit the onboard data 156 to the scheduler system 199 of the scheduler server 107 via the network 105.

The scheduler client 196 includes code and routines that are operable, when executed by the processor 125 of the vehicle 123, to cause the processor 125 to execute one or more of the following steps: aggregating the onboard data 156 and the route data 157; and instructing the communication unit 145 of the vehicle 123 to regularly transmit the onboard data 156 and the route data 157 to the scheduler system 199 of the scheduler server 107 via the network 105. In some embodiments, the communication unit 145 of the vehicle 123 receives the notification data 173 from scheduler system 199 via the network 105 responsive to instances of wireless messages that include the onboard data 156 and route data 157.

In some embodiments, the scheduler client 196 of the vehicle 123 may be implemented using hardware including a field-programmable gate array ("FPGA") or an application-specific integrated circuit ("ASIC"). In some other embodiments, the scheduler client 196 may be implemented using a combination of hardware and software.

The scheduler client 196 is described in more detail below with reference to FIGS. 1B, 2 and 3A-3E.

Scheduler Server 107

The scheduler server 107 will be described with reference to both FIGS. 1A and 1B. Referring to FIG. 1A, in some embodiments the scheduler server 107 is a cloud server that includes one or more of the following elements: a scheduler system 199; a processor 125; a memory 127; and a communication unit 145. These elements are communicatively coupled to one another via the bus 120B. The following elements of the scheduler server 107 are the same or similar to those described above for the vehicle 123, and so, the descriptions of these elements will not be repeated here: the processor 125; the memory 127; and the communication unit 145.

The memory 127 of the scheduler server 107 stores one or more of the following elements: vehicle model data set 174; factory digital twin data 176; service data 171 (e.g., environment data 181 and weather data 182); vehicle data 183 (e.g., measured data 172, onboard data 156, route data 157 and digital data that describes vehicle model for the vehicle 123); modified digital twin data 177; estimation data 175; simulation data 155; and notification data 173.

The vehicle model data set 174 includes digital data that describes one or more vehicle models for one or more real-world vehicles such as the vehicle 123. For example, the vehicle model data set 174 includes a set of instances of vehicle model data 184 (see, e.g., FIG. 1B) that describe a set of different vehicle models. In some embodiments, the vehicle model data set 174 includes an instance of vehicle model data 184 for each make and model of vehicle offered by a particular vehicle manufacturer (e.g., Toyota). In this way the vehicle model data set 174 includes a plurality of different vehicle models.

Referring to FIG. 1B, in some embodiments the vehicle model data 184 includes digital data that describes a vehicle model for a particular vehicle. In some embodiments, the vehicle model described by the vehicle model data 184 includes design information for the vehicle 123 and its individual vehicle components. For example, the design information includes (1) Computer-Aided Design (CAD) data from an Original Equipment Manufacturer (OEM) of the vehicle 123 or its individual vehicle components and (2) information that describes the software design for the vehicle 123, e.g., the software design for the onboard system set 180, the scheduler client 196 and other software included in the vehicle 123.

In some embodiments, the vehicle model data set 174 is indexed based on make and model so that the digital data that describes particular factory vehicle models are retrievable from the vehicle model data set 174 by querying the vehicle model data set 174 by specifying a particular make and model of a particular vehicle 123. For example, the scheduler system 199 initiates monitoring of a particular real-world vehicle such as the vehicle 123 (e.g., when the vehicle is sold by a dealer or its manufacture is completed). The scheduler system 199 receives digital data describing the make and model of the vehicle 123. In some embodiments, the make and model of a particular vehicle 123 are identifiable based on the vehicle identification number (VIN) for the particular vehicle 123. The scheduler system 199 queries the vehicle model data set 174 using the make and model information of the vehicle 123 to identify, from the vehicle model data set 174, the particular vehicle model data 184 for this particular vehicle 123.

In some embodiments, the scheduler system 199 generates an instance of factory digital twin data 176 for this particular vehicle 123 based on the vehicle model data that is associated with the VIN for this particular vehicle 123. The vehicle model data 184 describes the design of the particular vehicle 123 associated with the VIN, whereas the factory digital twin data 176 includes all the digital data necessary to cause the game engine 166 to generate a virtual version of the particular vehicle 123 associated with the VIN. In some embodiments, the vehicle model data 184 describes the hardware and software design of the vehicle 123. An example of the vehicle model data is depicted in FIG. 1B. See, e.g., the vehicle model data 184 depicted in FIG. 1B.

Referring to FIG. 1A, the preceding paragraph describes the scheduler system 199 generating factory digital twin data 176. In some embodiments, this is an optional feature of the scheduler system 199 as the scheduler system 199 can provide its function without the factory digital twin data 176. The schedule system 199 separately stores the instance of the factory digital twin data 176 in the memory 127 of the scheduler server 107. The schedule system 199 also stores an instance of the vehicle model data 184 in the memory 127 of the scheduler server 107 that is separate from a copy of the vehicle model data 184 which is stored in the vehicle model data set 174. This separately stored version of the vehicle model data 184 (i.e., the version that is not included in the vehicle model data set 174) is revised or modified by the scheduler system 199 as instances of onboard data 156 and measured data 172 are newly received over time.

For example, the scheduler system 199 monitors for onboard data 156 and measured data 172 that are received by the scheduler server 107 and associated with the VIN for this particular vehicle 123; the scheduler system 199 modifies the factory vehicle model data 184 based on the onboard data 156 and the measured data 172 to reflect the depreciation or appreciation described by one or more of the onboard data 156 and the measured data 172, and in this way outputs the modified vehicle model data for this particular vehicle 123 (see, e.g., the "first modified vehicle model data 161A" depicted in FIG. 1B). The scheduler system 199 then generates the modified digital twin data 177 based on this modified vehicle model data. This modified digital twin data 177 is operable to generate a digital twin of this particular vehicle 123 that accurately reflects the state of this particular vehicle 123 as it exists in the real-world (i.e., including any appreciation, depreciation or a combination of appreciation and depreciation). For example, the digital twin described by the modified digital twin data 177 accurately reflects the state of the vehicle 123 because this digital twin is generated based on a modified vehicle model data that is revised based on the onboard data 156 recorded by this particular vehicle 123 and the measured data 172 for this particular vehicle 123. See, for example, FIG. 1B and how the factory vehicle model data 184 is modified based on the first onboard data 156A and the first measured data 172A.

Referring to FIG. 1A, the modified digital twin data 177 includes all the digital data necessary to cause the game engine 166 to generate a virtual version of the particular vehicle 123 that includes modifications, relative to the factory digital twin of this vehicle 123, that accounts for any appreciation or depreciation described by the onboard data 156 and the measured data 172. As described below in more detail, the scheduler system 199 generates the modified digital twin data 177 based on the vehicle data 183 for a particular vehicle 123 whose digital twin is described by the modified digital twin data 177.

The scheduler system 199 continues to monitor for onboard data 156 and measured data 172 that are newly received by the scheduler server 107 and associated with the VIN for this particular vehicle 123; the scheduler system 199 updates the modified vehicle model data (e.g., the first modified vehicle model data 161A depicted in FIG. 1B) based on the newly received onboard data 156 and the measured data 172 so that the modified vehicle model data cumulatively reflects further depreciation or appreciation described by each instance of onboard data 156 and the measured data 172 that are received over time, and in this way the scheduler system 199 continuously updates a digital twin for a particular vehicle 123. See, for example, the Nth modified vehicle model data 161N depicted in FIG. 1B that is a modified version of the first vehicle model data 161A that is modified based on the Nth onboard data 156N and the Nth measured data 172N. Note that the modifications made to the Nth modified vehicle model data 161N are cumulative of each instance of onboard data 156 and measured data 172 that is received over time so that the Nth modified vehicle model data 161N accurately describes the current state of the vehicle 123 as it exists in the real-world.

In some embodiments, the newly received instances of onboard data 156 and measured data 172 may be included in the vehicle data 183 according to some embodiments. In this way, the scheduler system 199 generates new instances of modified digital twin data 177 over time based on a portion of the vehicle data 183 that is received via a feedback loop created by wireless communications with the vehicle 123 and the vehicle service server 108 via the network 105.

Referring to FIG. 1A, the factory digital twin data 176 includes all the digital data necessary to cause the game engine 166 to generate a virtual version of a particular vehicle 123 (i.e., a digital twin of the particular vehicle 123) in a simulation provided by the game engine 166. The digital twin generated based on the factory digital twin data 176 represents the particular vehicle 123 as manufactured, or in "new" condition. In other words, the digital twin generated based on the factory digital twin data 176 represents a vehicle 123 that is not depreciated or appreciated and is otherwise unaltered from its condition when manufactured.

The onboard data 156 is described above with reference to the vehicle 123, and so, that description will not be repeated here. The onboard data 156 is received by the communication unit 145 of the scheduler server 107 from the network 105. The communication unit 145 of the scheduler server 107 provides the onboard data to the scheduler system 199. The onboard data 156 includes digital data that uniquely identifies the particular vehicle 123 that recorded and transmitted the onboard data 156 (e.g., a VIN). The scheduler system 199 stores the onboard data 156 in the memory 127 of the scheduler server 107 in a way that indicates that this particular instance of onboard data 156 is associated with the particular vehicle 123 indicated by the VIN. In this way, the scheduler system 199 is able to accurately update the vehicle model for this particular vehicle 123 based on the onboard data 156. As used here, "the vehicle model for this particular vehicle 123" means the factory vehicle model data (e.g., the factory vehicle model data 184 as depicted in FIG. 1B) for this particular vehicle 123 if no modified vehicle model data (e.g., the first modified vehicle model data 161A or the Nth modified vehicle model data 161N depicted in FIG. 1B) exists for this particular vehicle 123, or the modified vehicle model data for this particular vehicle 123 if one exists in the memory 127 of the scheduler server 107 (e.g., the first modified vehicle model data 161A or the Nth modified vehicle model data 161N).

The measured data 172 includes digital data that describes a service event for a particular vehicle 123. In some embodiments, the measured data 172 includes the VIN for the particular vehicle 123 or some other digital data that uniquely identifies the particular vehicle 123 that received the service event. A service event is an event when the vehicle 123 is taken to a dealership, repair shop, used vehicle shop or some other vehicle maintenance service provider for servicing. The report system 140 is software installed in the vehicle service server 108 that is operated by one or more of these vehicle maintenance service providers. The report system reports the measured data 172 to the scheduler system 199 via the network 105 so that the measured data 172 can be included analysis and other functionality provided by the scheduler system 199. For example, the report system 140 causes the communication unit 145 of the vehicle service server 108 to report the measured data 172 to the scheduler system 199 via the network 105.

The modified digital twin data 177 includes digital data that describes a modified digital twin for the particular vehicle 123 that is generated based on the most recently generated instance of modified vehicle model data (e.g., the Nth modified vehicle model data 161N depicted in FIG. 1B). The modified digital twin data 177 includes all the digital data necessary to cause the game engine 166 to generate a virtual version of the particular vehicle 123 (i.e., a digital twin of the particular vehicle 123 as it exists in the real-world) in a simulation provided by the game engine 166. The digital twin generated based on the modified digital twin data 177 represents the particular vehicle 123 in a state that is different than its state as manufactured. In other words, the digital twin represents the particular vehicle 123 in a modified state that is accurate relative to the actual condition of the particular vehicle 123 in the real-world. The modified state of the vehicle 123 may include depreciation, appreciation or a combination of depreciation and appreciation (e.g., some components of the vehicle 123 are depreciated, while other components of the vehicle 123 are appreciated).

The scheduler system 199 includes code and routines that are operable, when executed by the processor 125 of the scheduler server 107, to cause the processor 125 to receive, as inputs, one or more of the following: the modified digital twin data 177 for a particular vehicle 123 [e.g., the most recent version of the modified digital twin data 177]; and the simulation data 155. The scheduler system 199 includes code and routines that are operable, when executed by the processor 125 of the scheduler server 107, to cause the processor 125 to perform one or more simulations based on these inputs. For example, the scheduler system 199 performs hundreds or thousands of simulations based on these inputs. In some embodiments, the simulations are configured so that vehicle components of the digital twin included in the simulation will fail in the simulation if these same vehicle components would fail in the real-world if the vehicle 123 were to be operated similar to how the digital twin is operated in the simulation. In this way, the simulations are operable to proactively estimate (or predict) future breakdown events for the vehicle 123 before these breakdown events occur in the real-world.

The estimation data 175 includes digital data that describes these proactive estimates of the future breakdown events for the vehicle 123 before they occur in the real-world. In some embodiments, the estimation data 175 includes digital data that describes one or more reservations for confirmed maintenance appointments that are scheduled to occur before the future breakdown events are estimated to occur. The confirmed maintenance appointments include appointments with one or more vehicle maintenance service providers who will modify the condition of the vehicle 123 in the real-world so that the breakdown events that occurred in the one or more simulations do not occur in the real-world.

In some embodiments, the scheduler system 199 includes code and routines that are operable, when executed by the processor 125 of the scheduler server 107, to cause the processor 125 to analyze the simulations provided by the scheduler system 199 and estimate one or more of the following: (1) whether particular vehicle components of the real-world version of the vehicle 123 will need to be replaced or repaired in the future (i.e., due to a failure of these particular components during the simulations that are performed by the scheduler system 199); and (2) an approximate time or some other interval (e.g., mileage, achieving a particular RPM or oil pressure for a certain amount of time, etc.) when the particular vehicle components are estimated to fail based on the simulations that are performed by the scheduler system 199.

In some embodiments, the scheduler system 199 includes code and routines that are operable, when executed by the processor 125 of the scheduler server 107, to cause the processor 125 to take steps to: (1) identify a vehicle maintenance service provider that can proactively repair or replace the particular vehicle components before they are estimated to fail [e.g., before the interval occurs in the real-world]; (2) schedule a reservation for the vehicle maintenance service provider to repair or replace the vehicle components that are estimated to fail in the future; and (3) provide a visual notification to the driver of the vehicle 123 using the display panel 150 so that the driver knows about the reservation.

In some embodiments, the estimation data 175 is digital data that describes one or more of the following: (1) the particular vehicle components of the real-world version of the vehicle 123 will need to be replaced or repaired in the future; (2) the approximate time or some other interval when the particular vehicle components are estimated to fail based on the simulations that are performed by the scheduler system 199; (3) an identity of a vehicle maintenance service provider that can proactively repair or replace the particular vehicle components before they are estimated to fail; and (4) and time and date for a confirmed reservation for the vehicle maintenance service provider to repair or replace the vehicle components that are estimated to fail in the future.

The notification data 173 is digital data that is operable to cause the display panel 150 to display graphical information that informs the driver of the vehicle 123 about the estimation data 175. The scheduler system 199 causes the communication unit 145 of the scheduler server 107 to transmit one or more of the notification data 173 and the estimation data 175 to the scheduler client 196 of the vehicle 123 via the network 105. The scheduler client 196 causes the display panel 150 to display the graphical information, including, for example, one or more visualizations. In some embodiments, the scheduler client 196 includes code and routines that are operable, when executed by the processor 125 of the vehicle 123, to cause the processor 125 to take steps to ensure that the vehicle 123 receives the scheduled maintenance such as pinging the driver with visual and audio reminders, causing the display panel 150 to display the mileage remaining until the next scheduled maintenance appointment and, in only extreme cases where operating the vehicle 123 would be life threatening or illegal, causing the vehicle 123 to become inoperative.

The functionality of the scheduler system 199 will now be described according with reference to the digital data it receives as inputs and the digital data it outputs according to some embodiments.

The simulation data 155 is digital data that describes one or more virtual roadway environments (e.g., a road surface and other features of the road surface) as well as one or more static and dynamic objects included in the virtual roadway environments (e.g., traffic signs, traffic lights, pedestrians, pot holes, animals, other vehicles, etc.). The digital twin is operated in the one or more virtual roadway environments (e.g., one per simulation) and encounters the one or more static and dynamic objects during the one or more simulations.

In some embodiments, the scheduler system 199 includes code and routines that are operable, when executed by the processor 125 of the scheduler server 107, to cause the processor 125 generate the simulation data 155 based on one or more of the environment data 181, the weather data 182 and the route data 157 for the vehicle 123 whose digital twin is included in the one or more simulations to be performed by the scheduler system 199. For example, the route data 157 describes one or more historical journeys of the vehicle 123, and the environment data 181 describes the roadway environment for these one or more historical journeys and the weather data describes weather forecasts of future weather events along the travel routes included in these one or more historical journeys. Using this information, the scheduler system 199 generates simulation data 155 that models historical journeys of the vehicle 123 and includes forecasted future weather for the geographical locations where these historical journeys occurred.

In some embodiments, the accuracy of the proactive estimations made by the scheduler system 199 are improved by configuring the simulations so that the one or more virtual roadway environments and the one or more static and dynamic objects described by the simulation data 155 are similar or the same as those that the vehicle 123 actually experiences in the real-world because this makes the simulations more realistic, and thus, more likely to accurate predict future breakdown events in the real-world.

In some embodiments, the modified digital twin included in the one or more simulations provided by the scheduler system 199 is operated during the one or more simulations in a manner that is consistent with the driver's real-life approach to driving the vehicle 123 in the real-world. For example, the modified digital twin is operated during these simulations in a manner that mimics the driver's real-life approach to driving, including, for example, the drivers' habitual speed of accelerator pedal operation, the driver's habitual quantity of brake pedal operation, the driver's habitual timing of steering operation, the driver's overall aggressiveness or timidity when operating the vehicle 123. The driver's real-life approach to driving the vehicle is described by the onboard data 156 that is used to generate the simulations. In some embodiments, the scheduler system 199 includes software (e.g., the modeling application 133 whose operation is controlled by the determination module 204) that generates a "driver behavior model" of the driver's real-life approach to driving the vehicle 123 based on the onboard data 156, and this driver behavior model is used to operate the modified digital twin in a manner that is consistent with the driver's real-life approach to driving the vehicle 123 in the real-world.

In some embodiments, the accuracy of the proactive estimations made by the scheduler system 199 are improved by configuring the simulations so that modified digital twin of the vehicle 123 is operated in a manner that that is consistent with the driver's real-life approach to driving the vehicle 123 in the real-world because this makes the simulations more realistic, and thus, more likely to accurate predict future breakdown events in the real-world.

The service data 171 includes digital data that is used by the scheduler system 199 to generate the simulation data 155. The service data 171 includes the environment data 181 and the weather data 182. The environment data 181 is digital data that describes physical measurements of these roadways in a geographic area. For example, the environment data describes the surface roughness, angle of slopes, average speeds, etc. for the routes described by the route data 157. The weather data 182 is digital data that provides forecasts for future weather events, as well as information about past weather events, along the routes described by the route data 157. For example, the weather data 182 describes quantities of rain, temperature, humidity, etc.

In some embodiments, new instances of route data 157, environment data 181 and weather data 182 are received over time as part of a feedback look, and the scheduler system 199 uses these new instances of service data 171 to generate new or updated simulation data 155 which is used to perform new or additional simulations based on one or more of the following: the vehicles 123 most recent historical journeys as described by new instances of route data 157; new weather forecasts as described by new instances of weather data 182; modifications to the roadway environment as described by new instances of environment data 181; and new roadway environments as described by the environment data 181.

In some embodiments, the scheduler system 199 includes code and routines that are operable, when executed by the processor 125 of the scheduler server 107, to cause the processor 125 to generate the modified digital twin data 177 based on a portion of the vehicle data 183 for a particular vehicle 123 (e.g., the onboard data 156 and the measured data 172 for this vehicle 123). The vehicle data 183 includes digital data that describes the vehicle 123 and is used by the scheduler system 199 to generate the modified digital twin data 177 that describes a modified digital twin of the vehicle 123 that is consistent with the condition or state of the vehicle 123 as it exists in the real-world.

The vehicle data 183 includes one or more of the following: the factory vehicle model data 184; the route data 157; the onboard data 156; the measured data 172; and, optionally, the factory digital twin data 176 that is generated based on the factory vehicle model data 184. The factory vehicle model data 184, the route data 157, the onboard data 156 and the factory digital twin data 176 are described above, and so, those descriptions will not be repeated here. The measured data 172 is digital data that describes physical measurements of the vehicle 123 in the real-world ad measured by vehicle maintenance service provider. For example, the measured data 172 describes the depth of the tire tread groove, width of the brake friction pad, amount of battery charge, tire air pressure, vehicle mileage, oil pressure, etc. In some embodiments, the measured data 172 also describes the VIN number of the vehicle 123, and any upgrades or component replacements/modifications made to the vehicle 123 since the time of its manufacture. The scheduler system 199 uses the vehicle data 183 to determine the present condition of the vehicle 123 as it (i.e., the vehicle 123) exists in the real-world and generate a modified digital twin data 177 that is operable to generate a digital twin of the vehicle 123 that is consistent with the present condition of the vehicle 123 as it exists in the real world.

The scheduler system 199 includes code and routines that are operable, when executed by the processor 125 of the scheduler server 107, to cause the processor 125 to analyze the one or more simulations generated by the scheduler system 199 to generate the estimation data 175 and the notification data 173.

In some embodiments, the simulation data 155 includes all the digital data necessary to create static and dynamic objects in one or more simulations provided by the game engine 166. The simulation data 155 may be operable to cause the static and dynamic objects included in the one or more simulations to have realistic behavior and realistic physical properties. The one or more simulations include the digital twin of the particular vehicle 123 (e.g., the modified digital twin). The simulation data 155 may be generated by the game engine 166 based one or more of the following types of digital data: (1) the modified digital twin data 177 (e.g., the most recent instance of modified digital twin data 177 for the vehicle 123); (2) the service data 171; and (3) the vehicle data 183.

In some embodiments, the estimation data 175 is digital data describing the performance of the digital twin while operating in the simulation provided by the game engine 166. For example, the estimation data 175 describes how discrete virtualized vehicle components included in the digital twin performed under certain situations presented to the digital twin during the simulation. The estimation data 175 may be generated by the game engine 166 based on the operation of the digital twin during the course of one or more simulations provided by the game engine 166 based on the simulation data 155. A digital twin may include a plurality of "digital components." Each "digital component" of a digital twin is a digital representation of a real-life vehicle component of the vehicle 123. In some embodiments, the estimation data 175 describes the current state of each digital component of the digital twin relative to the expected service life for each vehicle component of the vehicle 123 as indicated by the vehicle model for this particular vehicle 123. The current state of one or more digital components during a simulation may indicate that these components are "failed" or are the cause of a breakdown event that occurred during a simulation. In this way, the scheduler system 199 estimates future breakdown events or vehicle components that need to be modified proactively in order to prevent a future breakdown event for the vehicle 123 in the real-world.

The scheduler system 199 includes one or more of the following elements: a modeling application 133; and a game engine 166.

In some embodiments, the modeling application 133 includes code and routines that are operable, when executed by the processor 125 of the scheduler server 107, to generate a vehicle model. In some embodiments, the vehicle model that describes the hardware and software design of the vehicle 123 in its factory condition, which may be collectively referred to as a "vehicle design" for the vehicle 123. In some embodiments, the vehicle model is described by the vehicle model data (see, e.g., the vehicle model data 184 depicted in FIG. 1B). In other words, the modeling application generates the vehicle model data 184 based on the vehicle design for the vehicle 123. The modeling application 133 receives the vehicle model data 184 and generates the factory digital twin data 176 based on the vehicle model data 184. The modeling application 133 may generate and modify the factory digital twin data 176 based on one or more instances of onboard data 156 and measured data 172, and thereby generate the modified digital twin data 177 based on the factory digital twin data 176 and one or more of the following: the cumulative instances of onboard data 156 that are received for the vehicle 123 as of a time (e.g., a current time); and the cumulative instances of measured data 172 that are received for the vehicle 123 as of the time.

In some embodiments, additional instances of onboard data 156 and/or measured data 172 are received by the scheduler system 199 for this particular vehicle 123. The modeling application 133 modifies the modified digital twin data 177 based on one or more instances of onboard data 156 and measured data 172 that are received from the vehicle 123, and thereby generates a second version of the modified digital twin data 177 (e.g., the Nth modified vehicle model data 161N depicted in FIG. 1B) based on the prior version of the modified digital twin data 177 (e.g., the first modified vehicle model data 161A depicted in FIG. 1B) and the additional instances of one or more of the following: one or more additional instances of onboard data 156; and one or more additional instances of measured data 172. In some embodiments, additional versions of the modified digital twin data 177 (e.g., a third version, a fourth version, a fifth version, etc.) are generated by the scheduler system 199 as additional instances of onboard data 156 and measured data 172 are received for this particular vehicle 123.

Initially, the factory digital twin data 176 may be based on the vehicle design of the vehicle 123 described by the vehicle model data 184 without any depreciation events or appreciation events. The vehicle model data 184 may be retrieved from the vehicle model data set 174 or inputted as one or more files updated to the scheduler system 199 by a vehicle design engineer or some other administrator of the scheduler server 107. However, over time depreciation and appreciation events occur (e.g., the vehicle 123 is driven and accrues mileage, the vehicle 123 is involved in a collision, the oil for the vehicle 123 is changed, the brake pads for the vehicle 123 are changed, other wear-and-tear events, etc.) the modeling application 133 generates the modified digital twin data 177 based on the onboard data 156 and any measured data 172 received from the network 105. In this way, the digital twin used for simulations is modified by the modeling application 133 to generate the modified digital twin data 177 which accurately reflects the current state of the vehicle 123 in the real-world as described by the onboard data 156 and the measured data 172.

In some embodiments the scheduler system 199 includes one or more modeling applications 133. Different modeling applications 133 may be specialized for generating or modifying particular types of digital models (herein "models") which are included in the vehicle design described by the factory digital twin data 176 or the modified digital twin data 177. For example, the scheduler system 199 may include one or more of the following modeling applications: Dymola (produced by Dassault Systemes AB, Lund of Velizy-Villacoublay, France, and used to generate a vehicle model); MapleSim (produced by Maplesoft of Waterloo, Ontario, and used to generate a vehicle model); Simulink (produced by MathWorks of Natick, Mass., and used to generate models of a the one or more ADAS systems of the vehicle); and PreScan (produced by TASS International of the Netherlands, and used to generate models of a the one or more ADAS systems of the vehicle), etc.

The modeling application 133 may also generate other models used by the game engine 166. For example, the modeling application 133 may generate a model describing a virtual roadway environment for inclusion in the simulation provided by the game engine 166. The modeling application 133 may also generate a model describing virtual and static objects which are included in the simulation provided by the game engine 166.

The game engine 166 may include code and routines that are operable, when executed by the processor of the scheduler server 107, to generate a simulation based on the one or more models generated by the one or more modeling applications 133. In some embodiments, the simulation data 155 describes these one or more models. An example of the game engine 166 may include the Unity game engine (produced by Unity Technologies of San Francisco, Calif.) or some other game engine.

In some embodiments, the game engine 166 includes software for generating the vehicle roadway model based on inputs provided by a human administrator of the scheduler server 107 or other data uploaded to the scheduler server 107 (e.g., via the network 105 or some other data uploaded to the scheduler server 107 such as via a memory card or some other non-transitory memory). One or more of the game engine 166 and the modeling application 133 may generate the one or more models that describe the one or more dynamic objects and the behavior of these dynamic objects. In other embodiments, the environment data 181 is used to generate the vehicle roadway model without human input.

In some embodiments, the game engine 166 includes software that is operable, when executed by the processor of the scheduler server 107, to generate the simulation data 155. The game engine 166 may generate the simulation data 155 based on the modified digital twin data 177 and other digital data, such as the service data 171, that describes the different models discussed above. The simulation data 155 and the game engine 166, when executed by the processor 125, may cause the processor 125 to generate one or more simulations for testing the operation of a virtual vehicle (e.g., a modified digital twin of the vehicle 123) which accurately represents the operation of vehicle 123 based on its current state as described by the onboard data 156 and the measured data 172 since the modeling application 133 has modified the factory digital twin data 176 based on the onboard data 156 and the measured data 172 to generate the modified digital twin data 177.

In some embodiments, the game engine 166 runs one or more simulations to test and evaluate the performance of the modified digital twin in the one or more simulations. The game engine 166 generates the one or more simulations using the simulation data 155. The simulation data 155 is determined by the game engine 166 using the latest version of the modified digital twin data 177. In this way, the simulation data 155 enables the game engine 166 to generate the one or more simulations which test the operation of the digital twin with accurately represents the operation of real-world vehicle 123 based on its current state as described by the onboard data 156 and the measured data 172. In other words, the digital twin, when simulated by the game engine 166, accurately simulates the performance of the vehicle 123 while experiencing the modified performance caused by the depreciation events and appreciation events described by the onboard data 156 and the measured data 172. As the one or more simulations are running, the game engine 166 generates the estimation data 175, which describes the performance of the digital twin while operating in the one or more simulations relative to the design specification for the vehicle 123.

The design specification for the vehicle 123 includes digital data that describes the vehicle design for the vehicle 123 and how its discrete vehicle components operate when their operation conforms to the vehicle design, as well as the expected service life for each of these vehicle components and how these vehicle components perform at different points in their service life (which can then be used to estimate the current state of each vehicle component based on analysis of the one or more simulations performed by the game engine 166). The specifications for the one or more vehicle components describes the design of these vehicle components and how they should operate when included in the vehicle design. In some embodiments, the specification for the vehicle 123 or the specifications for the one or more vehicle components describe a level of performance that the vehicle components of the vehicle 123 should provide for the vehicle 123 in order for the vehicle 123 to operate in accordance with its design.

In some embodiments, the scheduler system 199 includes code and routines that are operable, when executed by the processor 125 of the scheduler server 107, to cause the processor 125 to generate the notification data 173 based on the estimation data 175 and cause the communication unit 145 of the scheduler server 107 to transmit the notification data 173 to the network 105. A computing device operated by an end user (e.g., a smartphone, a laptop, etc.) then receives the notification data 173 from the network 105 and provide one or more visualizations described by the notification data 173 to an end user (e.g., a driver of the vehicle 123) via the display panel 150.

Examples of modeling applications 133 and game engines 166 used in some of the embodiments described herein are described in U.S. patent application Ser. No. 15/135,135 filed on Apr. 21, 2016 and entitled "Wind Simulation Device," the entirety of which is hereby incorporated by reference. See, for example, the "virtual simulation tool" described in U.S. patent application Ser. No. 15/135,135. Embodiments of this technology are also discussed in U.S. patent application Ser. No. 15/074,842 filed on Mar. 18, 2016 and entitled "Vehicle Simulation Device for Crowd-Sourced Vehicle Simulation Data," the entirety of which is hereby incorporated by reference. Embodiments of this technology are also discussed in U.S. patent application Ser. No. 15/085,644 filed on Mar. 30, 2016 and entitled "Dynamic Virtual Object Generation for Testing Autonomous Vehicles in Simulated Driving Scenarios," the entirety of which is hereby incorporated by reference. One or more of the scheduler system 199 and the scheduler client 196 described herein may be modified to include any of the elements described in U.S. patent application Ser. No. 15/135,135, U.S. patent application Ser. No. 15/085,644 and U.S. patent application Ser. No. 15/074,842.

In some embodiments, the scheduler system 199 of the scheduler server 107 may be implemented using hardware including a FPGA or an ASIC. In some other embodiments, the scheduler system 199 may be implemented using a combination of hardware and software. The scheduler system 199 may be stored in a combination of the devices (e.g., servers or other devices). The scheduler system 199 is described in more detail below with reference to FIGS. 1B, 2 and 3A-3E.

The vehicle service server 108 is a hardware server similar to the scheduler server 107. The vehicle service server 108 is operated by a vehicle maintenance service provider. The vehicle service server 108 includes a report system 140 that collects measured data 172 as measured by the technicians and personnel of the vehicle maintenance service provider when servicing the vehicle 123. For example, the report system 140 causes an electronic display (e.g., a computer monitor) to display a graphical user interface depicting an electronic form and a technician inputs information about the vehicle 123 into the electronic form, and this information is described by the measured data 172. The communication unit 145 of the vehicle service server 108 provides the measured data 172 recorded at the vehicle maintenance service provider to the network 105, and the communication unit 145 of the scheduler server 107 receives the measured data 172 from the network 105 and takes steps that cause the measured data 172 to be stored in the memory 127 of the scheduler server 107.

The map server 109 is a hardware server similar to the scheduler server 107. The map server 109 is operated by a service provider that has access to the environment data 181. In practice, the map service provider could be a non-traditional source such as a government entity, university or automobile manufacturer which tracks the environment data 181. The environment data 181 is digital data that describes physical measurements of these roadways in a geographic area. For example, the environment data 181 describes the surface roughness, angle of slopes, average speeds, etc. The map server 109 includes a communication unit 145 that reports the environment data 181 to the scheduler system 199 via the network 105. The communication unit 145 of the map server 109 provides the environment data 181 to the network 105, and the communication unit 145 of the scheduler server 107 receives the environment data 181 from the network 105 and takes steps that cause the environment data 181 to be stored in the memory 127 of the scheduler server 107.

The weather server 110 is a hardware server similar to the scheduler server 107. The weather server 110 is a server operated by an electronic weather service provider. The weather data 182 is digital data that provides forecasts for future weather events, as well as information about past weather events. The weather data 182 describes, for example, quantities of rain, temperature, humidity, etc. The weather server 110 includes a communication unit 145 that reports the weather data 182 to the scheduler system 199 via the network 105. The communication unit 145 of the weather server 110 provides the weather data 182 to the network 105, and the communication unit 145 of the scheduler server 107 receives the weather data 182 from the network 105 and takes steps that cause the weather data 182 to be stored in the memory 127 of the scheduler server 107.

In some embodiments, one or more of the onboard data 156 and the measured data 172 describes a vehicle component of the vehicle 123. For example, the vehicle 123 a set of components and one or more of the onboard data 156 and the measured data 172 describes a state or condition of one or more of these vehicle components. The vehicle 123 may include sensors that are operable to measure the information about these vehicle components which is described by the onboard data 156 or the measured data 172. Optionally, for measured data 172, a technician or some other user may use a hand-held sensor that measures the information about these vehicle components.

In some embodiments, example vehicle components include one or more of the following: an engine; a brake; a brake line; a fuel injector; a fuel line; a power steering unit; a transmission; a tire; a filter; a vehicle fluid; a brake pad; a brake rotor; a sensor; an onboard vehicle computer; a windshield; a battery; a windshield wiper; a windshield; an alternator; a spark plug; a sparkplug wire; a battery wire; a distributor cap; a vehicle body panel; a infotainment system component; a powertrain component; and a belt. For example, a vehicle component is damaged, replaced or otherwise depreciated or appreciated, and one or more of the measured data 172 and the onboard data 156 describe this event and a quantity for the depreciation or the appreciation for the vehicle component.

In some embodiments, examples of depreciation or appreciation of the vehicle 123 include one or more of the following: an engine is repaired; an engine is damaged; a brake line is cut; a brake line is patched or reinstalled; a fuel injector is clogged; a fuel injector has exceeded its lifespan and is now malfunctioning; a fuel injector is cleaned; a fuel injector is repaired or replaced; a power steering unit is worn out; a power steering unit is replaced; a power steering unit has its power steering fluid replaced or topped off; a transmission is slipping or otherwise malfunctioning; a transmission is replaced, repaired or has its transmission fluid replaced; a tire is inflated below or above its recommended air pressure; the tread of a tire is worn down below its recommended level; a tire has not been rotated within its recommended cycle for rotating tires; a tire is inflated to its recommended tire pressure; a tire is replaced; a tire is rotated; a filter is clogged; a filter is used for its recommended term or past its recommended term; a filter is replaced; a filter is cleaned; a vehicle fluid is contaminated or otherwise rendered defective; a vehicle fluid is replaced or topped off; a brake pad is worn; a brake pad is replaced; a brake rotor is scratched or damaged; a brake rotor is replaced or resurfaced; a sensor is dirty, damaged or otherwise malfunctioning or not providing sensor data; a sensor is cleaned, re-wired, replaced or its driver is updated; a sensor's fuse is replaced; an onboard vehicle computer is malfunctioning or not responding; an onboard vehicle computer is replaced, rewired or updated; a windshield is cracked, chipped or otherwise damaged; a windshield is repaired or replaced; a battery fluid is low, a battery's terminals are dirty, a battery will not hold a charge; a battery's wires or wire insulation is frayed, cut or otherwise defective; a battery's fluid (e.g., water) is replaced or topped off; a battery's terminals are cleaned; a battery's wires or replaced or repaired; a windshield wiper is used past its useful life; a windshield wiper is replaced or its cleaning blade is replaced; an alternator is shorted, used past its useful life or otherwise not outputting enough current to maintain a battery's charge; an alternator is replaced, an alternator's belt is replaced or tightened; a spark plug is malfunctioning, a spark plug is replaced or re-gapped; a sparkplug wire is shorted or damaged; a sparkplug wire is replaced; a distributor cap has a short or is otherwise malfunctioning; a distributor cap is replaced; a vehicle body panel is dented, bent, warped, scratched, has damaged or undesirable paint or is otherwise damaged or undesirable; the vehicle body panel is repaired, replaced or repainted; a infotainment system component is damaged or malfunctioning; the infotainment system component is replaced; a powertrain component is malfunctioning; a powertrain component is repaired or replaced; a belt is worn or loose; a belt is tightened or replaced; etc. These examples are intended to be illustrative and not limiting.

Examples of vehicle components being measured are described in U.S. patent application Ser. No. 15/363,368 filed on Nov. 29, 2016 and entitled "Optimization of a Vehicle to Compensate for Water Contamination of a Fluid of a Vehicle Component," the entirety of which is hereby incorporated by reference.

Accordingly, in some embodiments the scheduler system 199 includes software that is operable to generate a modified digital twin of a vehicle 123. The scheduler system 199 includes software that is operable to use this modified digital twin to generate simulations based on: (1) the real-life journeys, expected future journeys, actual driving routes, actual mechanical condition, real-life weather conditions and forecasted weather conditions of the vehicle 123; and (2) the driver's real-life approach to driving the vehicle 123 (e.g., speed of accelerator pedal operation, quantity of brake pedal operation, timing of steering operation, overall aggressiveness or timidity). Based on these simulations, the scheduler system 199 incudes software that is operable to estimate future maintenance events (e.g., wear and tear) and proactively schedule maintenance appointments for the vehicle 123 so that, if the maintenance appointments are kept, the vehicle 123 continues to operate in accordance with its design specification. In some embodiments, the scheduler system 199 works with the scheduler client 196 to generate and provide in-vehicle notifications to the driver of the maintenance event and scheduled maintenance appointments for the vehicle 123.

By comparison, existing solutions simply use a cloud server to evaluate vehicle diagnostic information which is sourced from in-field vehicles. However, these existing solutions do not generate a digital twin or use vehicle simulations to evaluate the condition of the vehicle. Existing solutions also do not schedule maintenance appointments based on vehicle simulations using a digital twin which are configured to occur before an estimated breakdown event occurs in the real-world or provide in-vehicle notifications to the driver of the vehicle about the condition of the vehicle and the scheduled maintenance appointments for the vehicle that will prevent an estimated breakdown event from occurring.

Referring now to FIG. 1B, depicted is a block diagram illustrating a process flow 198 for the scheduler system 199 to provide estimation data 175 and notification data 173 according to some embodiments. The process flow 198 includes the following elements: the vehicle model data set 174; the factory vehicle model data 184; first onboard data 156A, Nth onboard data 156N; first measured data 172A; Nth measured data 172N; first modified vehicle model data 161A; Nth modified vehicle model data 161N; first modified digital twin data 177A; Nth modified digital twin data 177N; first simulation data 155A; Nth simulation data 155N; first environment data 181A; Nth environment data 181N; first weather data 182A; Nth weather data 182N; first route data 157A; Nth route data 157N; estimation data 175; and notification data.

The descriptions of the following elements are similar to the description of these elements which was provided above with reference to FIG. 1A, and so, those descriptions will not be repeated here: the vehicle model data set 174; the factory vehicle model data 184; the estimation data 175; and the notification data 173.

The descriptions for the first onboard data 156A and the Nth onboard data 156N is similar to the description of the onboard data 156 described above with reference to FIG. 1A and so, that description will not be repeated here. The first onboard data 156A describes the vehicle 123 at a first time and the Nth onboard data 156 describes the vehicle 123 at an Nth time, where N is any positive whole number that occurs after the first time. Similarly: the descriptions for the first measured data 172A and the Nth measured data 172N are similar to the description for the measured data 172; the descriptions for the first modified vehicle model data 161A and the Nth modified vehicle model data 161N is similar to the description for the simulation data 155; the descriptions for the first modified digital twin data 177A and the Nth modified digital twin data 177N is similar to the description for the modified digital twin data 177; the descriptions for the first simulation data 155A and the Nth simulation data 155N is similar to the description for the simulation data 155; the descriptions for the first environment data 181A and the Nth environment data 181N is similar to the description for the environment data 181; the descriptions for the first weather data 182A and the Nth weather data 182N is similar to the description for the weather data 182; and the descriptions for the first route data 157A and the Nth route data 157N is similar to the description for the route data 157.

The factory vehicle model data 184 is selected from the vehicle model data set 174. For example, the scheduler system 199 selects the factory vehicle model data 184 from the vehicle model data set 174 based on the make and model of a vehicle 123 as indicated by the VIN number for the vehicle 123. The scheduler system 199 may include a list of VIN numbers and the makes and models of the vehicles that are associated with each of these VIN numbers. In this way, the scheduler system 199 determines the make and model of the vehicle 123 based on the VIN number for the vehicle 123, and then selects the factory vehicle model data 184 for the vehicle 123 from the vehicle model data set 174 based on the make and model for the vehicle 123.

The scheduler system 199 receives the first onboard data 156A and the first measured data 172A at a first time. The first onboard data 156A and the first measured data 172A are instances of onboard data 156 and measured data 172 that are received at a first time and describe the appreciation or depreciation events for the vehicle 123 up to this first time. The first time is subsequent to the manufacture time of the vehicle 123 so that the first onboard data 156A and the first measured data 172A describe the vehicle 123 in a condition that is different from its new condition as it existed at the time of its manufacture. Similarly, the Nth onboard data 156N and the Nth measured data 172N are instances of onboard data 156 and measured data 172 that are received at an Nth time, where "N" is a variable indicating any positive whole number that occurs after the first time and describe additional appreciation or depreciation events for the vehicle 123 up to this Nth time. The ellipses and the downward arrow that says "Time" depicted in FIG. 1B indicate a passage of time from the first time to the Nth time.

The scheduler system 199 includes software that is operable to receive the first onboard data 156A and the first measured data 172A as inputs and modify the factory vehicle model data 184 based on these inputs to generate the first modified vehicle model data 161A. The first modified vehicle model data 161A is digital data that describes a version of the factory vehicle model data 184 that is modified to account for the first onboard data 156A and the first measured data 172. For example, if a component of the vehicle 123 has been changed in the real-world as of the first time, then this change is described by one or more of the first onboard data 156A and the first measured data 172A; the first modified vehicle model data 161A accounts for these changes so that the vehicle model described by the first modified vehicle model data 161A is consistent with how the vehicle 123 exists in the real-world.

In some embodiments, the scheduler system 199 includes software that is operable to generate the first modified digital twin data 177A based on the first modified vehicle model data 161A. The first modified digital twin data 177A is a version of the modified digital twin data 177 that accounts for all modifications to the vehicle 123 as of the first time so that the modified digital twin described by the first modified digital twin data 177A is consistent with the condition of the vehicle 123 as it exists in the real-world as of the first time.

The scheduler system 199 generates an instance of first simulation data 155A for the first time based on the first environment data 181A, the first weather data 182A, and the first route data 157A. The first route data 157A is an instance of the route data 157 that is current as of the first time. For example, the first route data 157A is digital data that describes one or more historical real-life journeys of the vehicle 123, actual driving routes of the vehicle 123, etc., as of the first time. The first environment data 181A and the first weather data 182A describe, for example, the roadway environment and the weather for the journeys and driving routes described by the first route data 157A. The first simulation data 155A may be associated with the first modified digital twin described by the first modified digital twin data 177A.

The scheduler system 199 generates one or more simulations for the first modified digital twin based on the first modified digital twin data 177A and the first simulation data 155A. In some embodiments, the simulations are configured so that the first modified digital twin is operated in a manner during the simulations that is consistent with how the vehicle 123 is driven in real-life.

An amount if time passes after the first time and the following types of digital data are received by the scheduler system 199 at an Nth time: Nth onboard data 156N; Nth measured data 172N; Nth route data 157N; Nth environment data 181N; and Nth weather data 182N.

The Nth onboard data 156N and the Nth measured data 172N are instances of onboard data 156 and measured data 172 that are received at an Nth time and describe the appreciation or depreciation events for the vehicle 123 up to this Nth time. The Nth time is subsequent to the first time so that the Nth onboard data 156N and the Nth measured data 172N describe the vehicle 123 in a condition that is different from its condition as it existed at the first time.

The scheduler system 199 includes software that is operable to receive the Nth onboard data 156N and the Nth measured data 172N as inputs and modify the first modified vehicle model data 161A (or whatever the most recent version of the vehicle model data is) based on these inputs to generate the Nth modified vehicle model data 161N. The Nth modified vehicle model data 161N is digital data that describes a version of the factory vehicle model data 184 that is modified to account for each of instance of onboard data 156 and measured data 172 that has been received by the scheduler system 199 up to and including the Nth time.

In some embodiments, the scheduler system 199 includes software that is operable to generate the Nth modified digital twin data 177N based on the Nth modified vehicle model data 161N. The Nth modified digital twin data 177N is a version of the modified digital twin data 177 that accounts for all modifications to the vehicle 123 as of the Nth time so that the modified digital twin described by the Nth modified digital twin data 177N is consistent with the condition of the vehicle 123 as it exists in the real-world as of the Nth time.

The scheduler system 199 generates an instance of Nth simulation data 155N for the Nth time based on the Nth environment data 181N, the Nth weather data 182N, and the Nth route data 157N. The Nth simulation data 155N may be associated with the Nth modified digital twin described by the Nth modified digital twin data 177N.

The scheduler system 199 generates one or more simulations for the Nth modified digital twin based on the Nth modified digital twin data 177N and the Nth simulation data 155N. In some embodiments, the simulations are configured so that the Nth modified digital twin is operated in a manner during the simulations that is consistent with how the vehicle 123 is driven in real-life.

An output of these simulations included in the process flow 198 is the estimation data 175. The notification data 173 is generated based on the estimation data 175.

Figure 2:
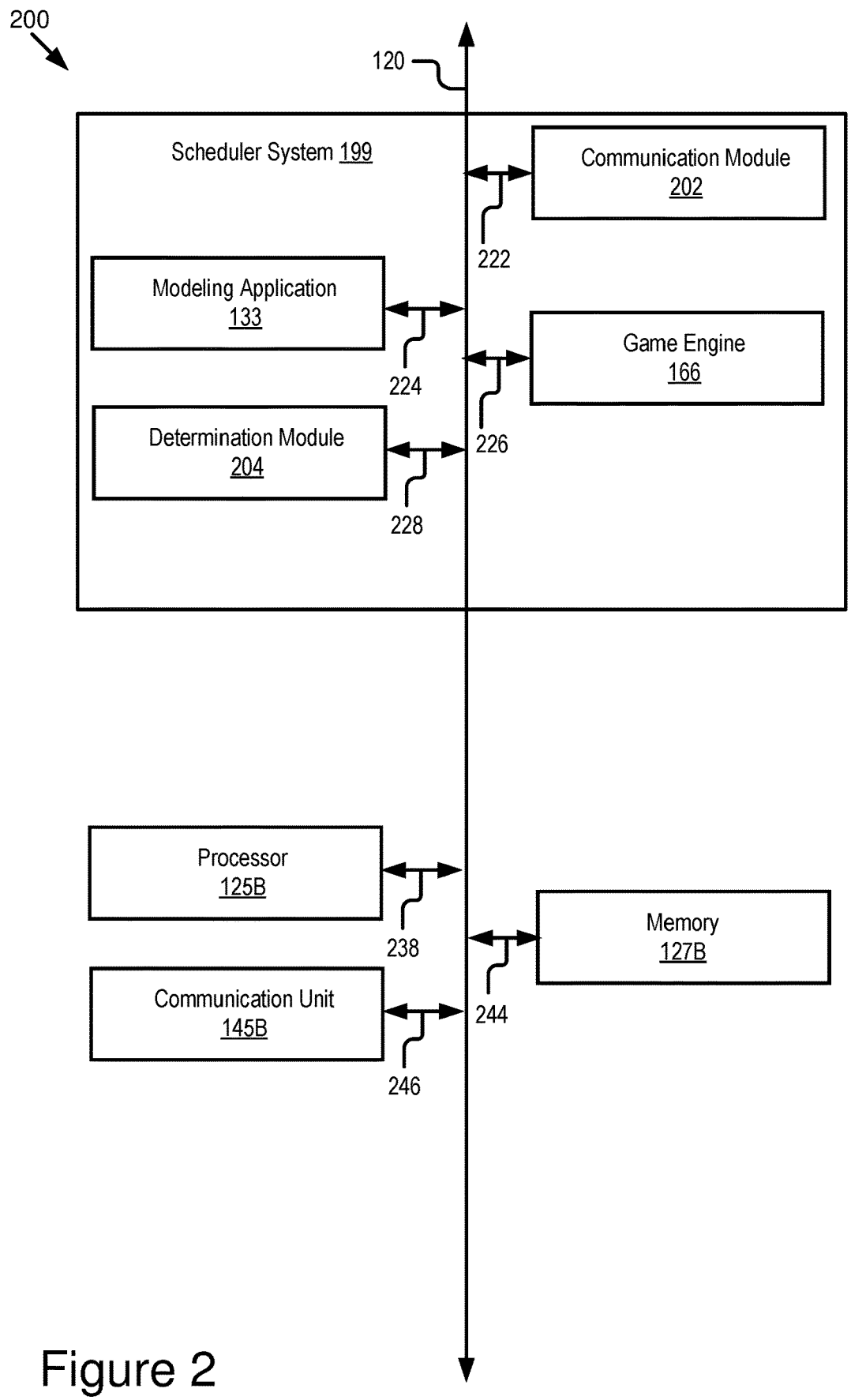
FIG. 2 is a block diagram illustrating an example computer system including the scheduler system according to some embodiments.

Referring now to FIG. 2, depicted is a block diagram illustrating an example computer system 200 including a scheduler system 199 according to some embodiments.

In some embodiments, the computer system 200 may include a special-purpose computer system that is programmed to perform one or more steps of a method 300 described below with reference to FIGS. 3A-3E.

In some embodiments, the computer system 200 may be an element the scheduler server 107.

In some embodiments, the scheduler system 199 is an element of the vehicle 123. In some embodiments, the computer system 200 may be an onboard vehicle computer of the vehicle 123. In some embodiments, the computer system 200 may include an electronic control unit, head unit or some other processor-based computing device of the vehicle 123.

The computer system 200 may include one or more of the following elements according to some examples: the scheduler system 199; the processor 125; the communication unit 145; and the memory 127. The components of the computer system 200 are communicatively coupled by a bus 120.

In the illustrated embodiment, the processor 125 is communicatively coupled to the bus 120 via a signal line 238. The communication unit 145 is communicatively coupled to the bus 120 via a signal line 246. The memory 127 is communicatively coupled to the bus 120 via a signal line 244.

The following elements of the computer system 200 were described above with reference to FIG. 1A, and so, those descriptions will not be repeated here: the processor 125; the communication unit 145; and the memory 127.

The memory 127 may store any of the data described above with reference to FIGS. 1A and 1B, or any other data described herein. The memory 127 may store any data necessary for the computer system 200 to provide its functionality.

In the illustrated embodiment shown in FIG. 2, the scheduler system 199 includes: a communication module 202; the modeling application 133; the game engine 166; and a determination module 204.

The communication module 202 can be software including routines for handling communications between the scheduler system 199 and other components of the computer system 200. In some embodiments, the communication module 202 can be a set of instructions executable by the processor 125 to provide the functionality described below for handling communications between the scheduler system 199 and other components of the computer system 200 or the operating environment 100.

The communication module 202 sends and receives data, via the communication unit 145, to and from one or more elements of the operating environment 100. The communication module 202 may send or receive any of the data or messages described above with reference to FIGS. 1A and 1B or below with reference to FIGS. 3A-3E via the communication unit 145.

In some embodiments, the communication module 202 receives data from components of the scheduler system 199 and stores the data in the memory 127. For example, the communication module 202: (1) receives the modified digital twin data 177 and newly received onboard data 156; and (2) transmits the modified digital twin data 177 and the newly received onboard data 156 to the modeling application so that the modified digital twin data 177 may be updated based on newly received onboard data 156. The communication module 202 then stores the updated version of the modified digital twin data 177 in the memory 127. In this example way, the digital twin for a vehicle is continuously updated as new information about the vehicle is received by the scheduler system 199. Other examples are possible.

In some embodiments, the communication module 202 may handle communications between components of the scheduler system 199. For example, the communication module 202 may receive modified digital twin data 177 from the modeling application 133 and transmit the modified digital twin data 177 to the game engine 166. The communication module 202 may receive estimation data 175 from the game engine 166 and transmit the estimation data 175 to the determination module 204 so that the notification data 173 may be generated based on the estimation data 175. The communication module 202 may receive notification data 173 from the determination module 204 and transmit the notification data 173 to the communication unit 145 with instructions for the communication unit 145 to transmit the notification data 173 to the network 105.

In some embodiments, the communication module 202 can be stored in the memory 127 of the computer system 200 and can be accessible and executable by the processor 125. The communication module 202 is adapted for cooperation and communication with the processor 125 and other components of the computer system 200 via signal line 222.

The modeling application 133 was described above with reference to FIG. 1A, and so, that description will not be repeated here.

In some embodiments, the modeling application 133 can be stored in the memory 127 of the computer system 200 and can be accessible and executable by the processor 125. The modeling application 133 is adapted for cooperation and communication with the processor 125 and other components of the computer system 200 via signal line 224.

The game engine 166 was described above with reference to FIG. 1A, and so, that description will not be repeated here.

In some embodiments, the game engine 166 can be stored in the memory 127 of the computer system 200 and can be accessible and executable by the processor 125. The game engine 166 is adapted for cooperation and communication with the processor 125 and other components of the computer system 200 via signal line 226.

In some embodiments, the determination module 204 includes code and routines that are operable, when executed by the processor 125, to cause the processor 125 to: (1) execute one or more digital twin simulations that identify components of the vehicle 123 that are estimated to fail in the future based on the digital twin simulations, thereby causing a breakdown event; and (2) proactively schedule maintenance for the vehicle 123 before the breakdown event occurs for the vehicle 123. In other words, the determination module 204 includes software that is operable to provide proactive vehicle maintenance scheduling for the vehicle 123 and thereby improve the operation of the vehicle 123 by preventing or reducing breakdown events for the vehicle 123. For example, the determination module 204 includes code and routines that are operable, when executed by the processor 125, to cause the processor 125 to execute one or more of the steps depicted in FIGS. 3A-3E.

In some embodiments, the determination module 204 includes code and routines that are operable, when executed by the processor 125, to cause the processor 125 to execute one or more portions of the process flow 198 described above with reference to FIG. 1B.

In some embodiments, the determination module 204 includes code and routines that are operable, when executed by the processor 125, to cause the processor 125 to control the operation of the modeling application 133 and the game engine 166.

In some embodiments, the determination module 204 can be stored in the memory 127 of the computer system 200 and can be accessible and executable by the processor 125. The determination module 204 is adapted for cooperation and communication with the processor 125 and other components of the computer system 200 via signal line 228.

Referring now to FIGS. 3A-3E, depicted is a flowchart of an example method 300 for providing a scheduler service for a real-world vehicle (e.g., the vehicle 123) according to some embodiments. The scheduler service includes one or more steps of the method 300. One or more of the steps described herein for the method 300 may be executed by one or more computer systems 200.

Figure 3A:
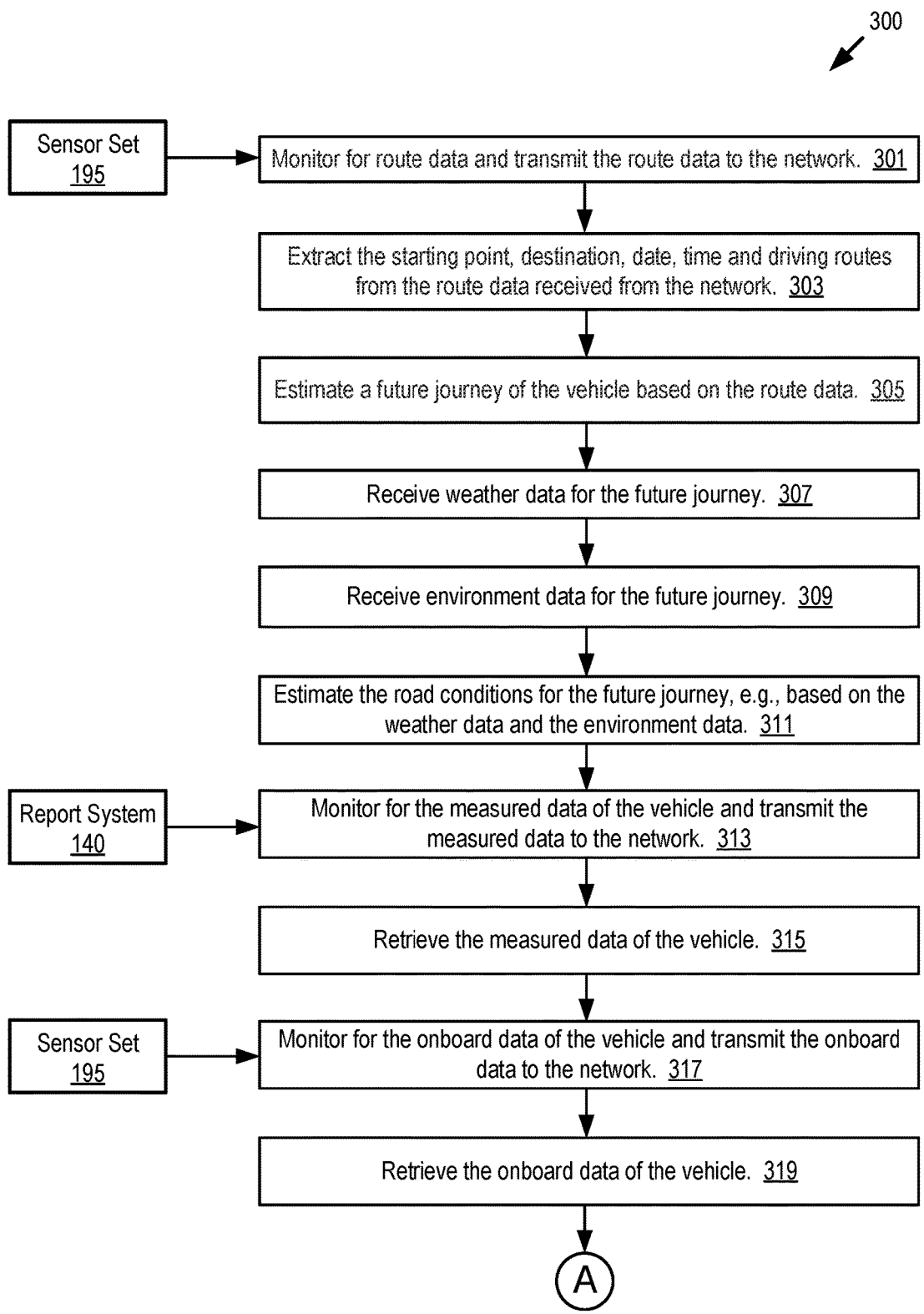

Referring to FIG. 3A, at step 301 the route data is collected and transmitted to the network in a wireless message. In some embodiments, the wireless message s addressed to the scheduler server that includes the scheduler system. The scheduler server receives the wireless message from the network.

At step 303, information is extracted from the route data. In some embodiments, the information includes starting points, destinations, dates, times, driving routes, etc.

At step 305, a future journey for the vehicle is estimated based on the route data (e.g., based on the information extracted from the route data). The future journey may include an estimated starting point for the future journey, an estimated destination for the future journey, an estimated date when the future journey will occur, an estimated time when the future journey will start and/or end and an estimated driving route for the future journey.

At step 307, weather data for the future journey is received.

At step 309, environment data for the future journey is received.

At step 311, road conditions for the future journey are estimated based on the weather data and the environment data.

At step 313, measured data for the vehicle is collected and transmitted to the network in a wireless message. This step may be executed by the report system of the vehicle service server. In some embodiments, the wireless message is addressed to the scheduler server that includes the scheduler system. The scheduler server receives the wireless message from the network and stores the measured data in the memory of the scheduler server.

At step 315, the measured data is retrieved from the memory. This step may be executed by the scheduler system.

At step 317, onboard data for the vehicle is collected and transmitted to the network in a wireless message. This step may be executed by the scheduler client. In some embodiments, the wireless message is addressed to the scheduler server that includes the scheduler system. The scheduler server receives the wireless message from the network and stores the onboard data in the e scheduler server.

At step 319, the onboard data is retrieved from the memory. This step may be executed by the scheduler system. A modified digital twin of the vehicle is generated.

Figure 3B:
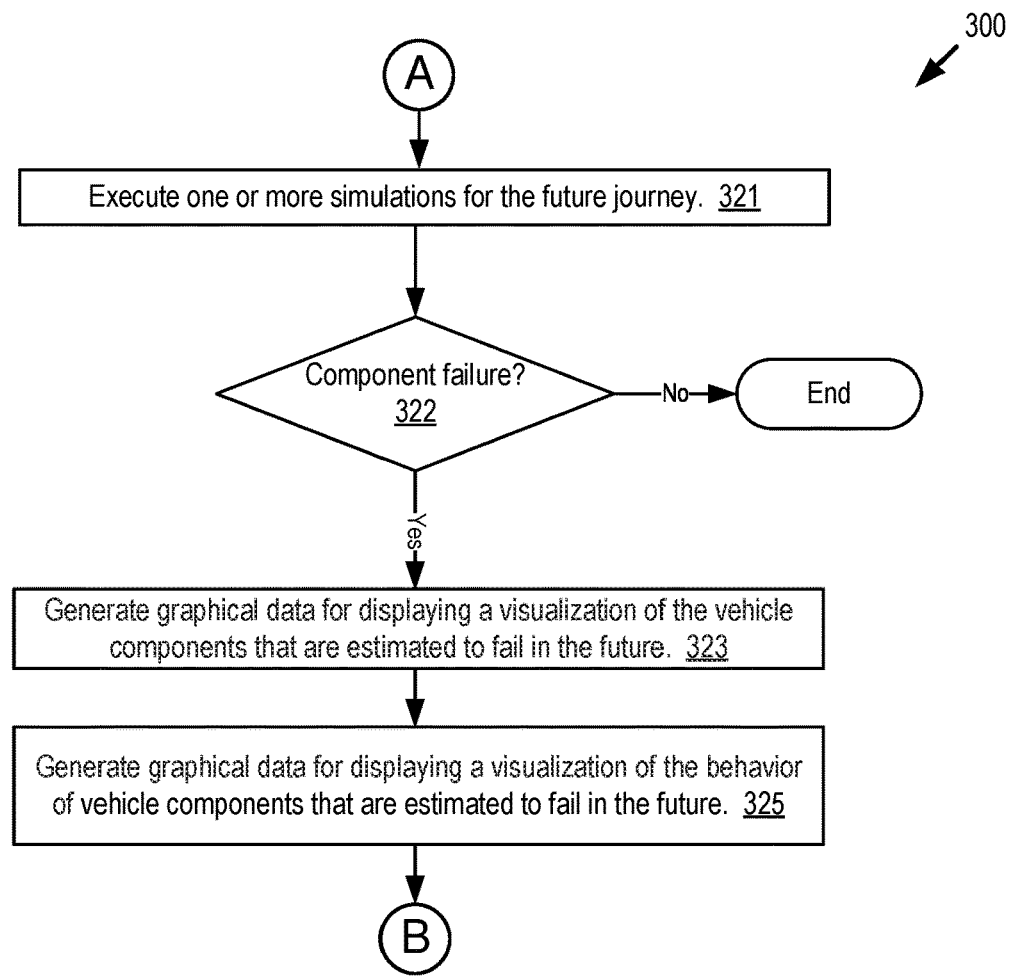

Referring now to FIG. 3B, at step 321 one or more simulations are executed for the future journey. The one or more simulations include the modified digital twin operated while traveling the estimated future journey and operated in manner consistent with how the vehicle is operated in real-life.

At step 322, the one or more simulations are analyzed to determine whether a digital component of the modified digital twin failed during the one or more simulations. If the analysis indicates that no component failure is detected, then the method 300 ends. If the analysis indicates that a component failure is detected for a digital component of the modified digital twin, then the method 300 proceeds to step 323. The analysis may include an estimate of an interval that must occur before the component will occur in the real-world as indicated by the one or more simulations. The digital components that fail in the one or more simulations represent real-world vehicle components that are estimated to fail in the future based on the one or more simulations.

At step 323, graphical data for displaying a visualization of the vehicle components that are estimated to fail in the future is generated. This graphical data may subsequently be included in the notification data at step 343.

At step 325, graphical data for displaying a visualization of the behavior of the vehicle components that are estimated to fail in the future is generated. This graphical data may subsequently be included in the notification data at step 343.

Figure 3C:
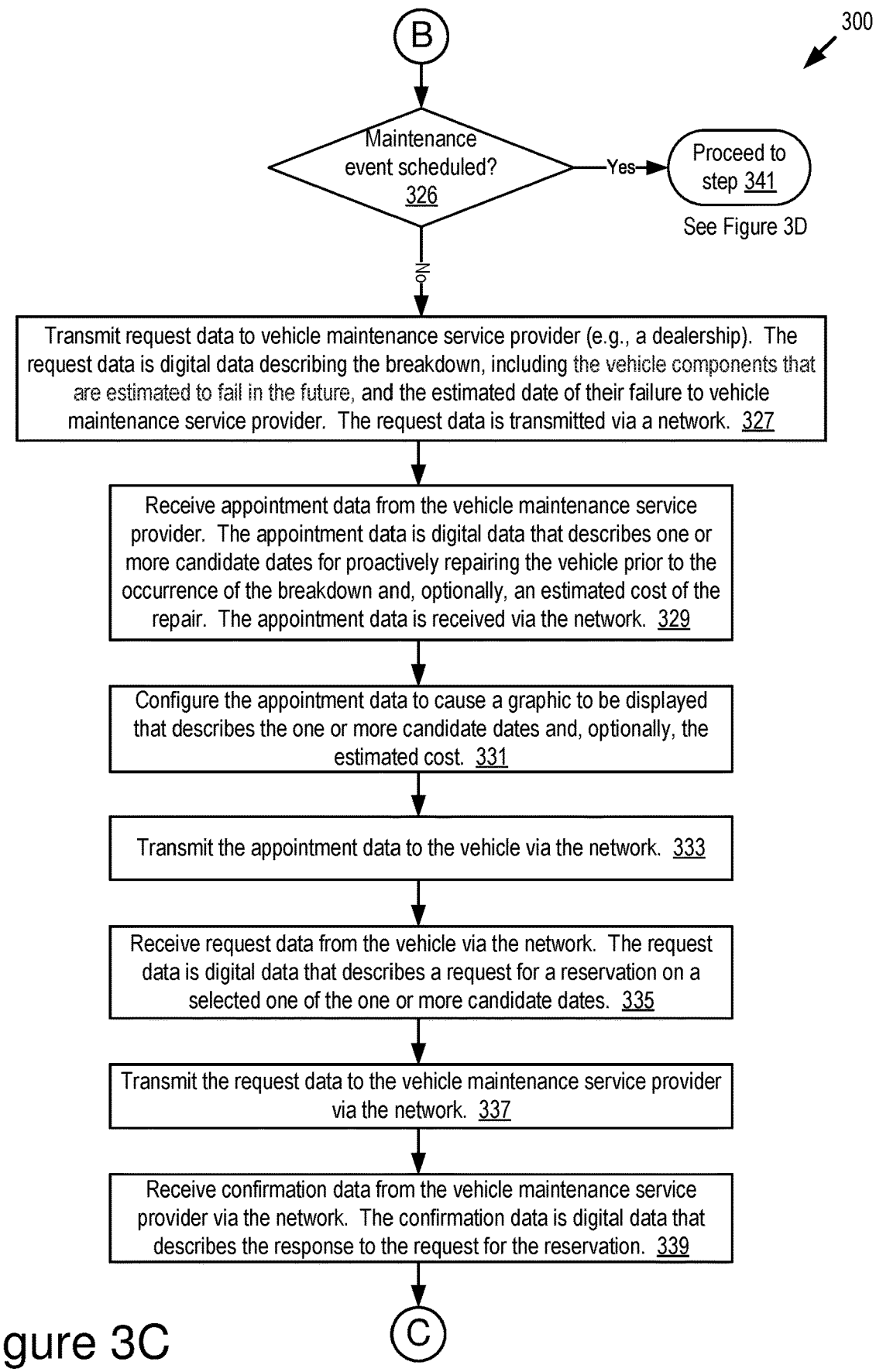

Referring to FIG. 3C, at step 326 a determination is made regarding whether a maintenance event is already scheduled to modify the vehicle components that are estimated to fail in the future. If the determination at step 326 indicates that no maintenance event is scheduled, then the method 300 proceeds to step 327. If the determination at step 326 indicates that a maintenance event is already scheduled, then the method 300 proceeds to step 341.

At step 327, request data is transmitted to a vehicle maintenance service provider. The request data is digital data describing the breakdown, including the vehicle components that are estimated to fail in the future, and the estimated date of their failure to vehicle maintenance service provider. The request data is transmitted via a network.

At step 329, appointment data is received from the vehicle maintenance service provider. The appointment data is digital data that describes one or more candidate dates for proactively repairing the vehicle prior to the occurrence of the breakdown and, optionally, an estimated cost of the repair. The appointment data is received via the network.

At step 331, configure the appointment data to cause a graphic to be displayed that describes the one or more candidate dates and, optionally, the estimated cost. This step may be executed by the scheduler server.

At step 333, the appointment data is transmitted to the network. The appointment data may be included in a wireless message that is addressed to the vehicle. The graphic displaying the one or more candidate dates may be displayed by the display panel and the driver may provide an input selecting one of the candidate dates. The selected candidate data may be the subject of a reservation request that is described by request data that is transmitted to the network. The request data may be included in a wireless message that is addressed to the scheduler server.

At step 335, request data is received from the vehicle via the network. The request data is digital data that describes a request for a reservation on a selected one of the one or more candidate dates.

At step 337, the request data is transmitted to the vehicle maintenance service provider via the network. The vehicle maintenance service provider can accept the appointment (and thereby confirm the reservation) or take steps to arrange for a new appointment date.

At step 339, confirmation data is received from the vehicle maintenance service provider via the network. The confirmation data is digital data that describes a response of the vehicle maintenance service provider to the request for the reservation as described in the request data.

Referring to FIG. 3D, at step 340 a determination is made regarding whether the vehicle maintenance service provider accepted (or confirmed) the reservation described in the request for the reservation based on the confirmation data. If the vehicle maintenance service provider did not accept the reservation, then the method 300 proceeds to step 327 depicted in FIG. 3C. If the vehicle maintenance service provider did accept the reservation, then the method 300 proceeds to step 341.

At step 341, estimation data describing one or more of the service to be provided, the cost of the service, a confirmation of the reservation and the visualizations are generated.

At step 343, the notification data is generated based on the estimation data and transmitted to the network. The notification data may be included in a wireless message that is address to the vehicle.

At step 344, a determination is made regarding whether the vehicle component that is estimated to fail may cause an injury of render the vehicle illegal to drive. If the determination is negative, then the method 300 ends. If the determination is positive, then the method 300 proceeds to step 345.

At step 345, a distance between the location of the vehicle and the location of the vehicle maintenance service provider is determined.

At step 346, a determination is made regarding whether the distance satisfies a threshold (e.g., is the vehicle presently located at the same location as the vehicle maintenance service provider). If the determination is negative, then the method 300 proceeds to step 301 (optionally, the display panel of the vehicle may display the distance remaining for the vehicle to travel to the location of the vehicle maintenance service provider). If the determination is positive, then the method 300 proceeds to step 347.

At step 347, a determination is made regarding whether the reservation for the maintenance event occurs today. If the determination is negative, then the method 300 proceeds to step 349 depicted in FIG. 3E. If the determination is positive, then the method 300 proceeds to step 348.

At step 348, the vehicle is allowed to be operated. Optionally, the vehicle is automatically navigated to the geographical location of the vehicle maintenance service provider. This may include navigation instructions or remote autonomous operation of the vehicle by a manufacturer of the vehicle. The display panel of the vehicle may display a message indicating that the vehicle can be operated.

Figure 3E:
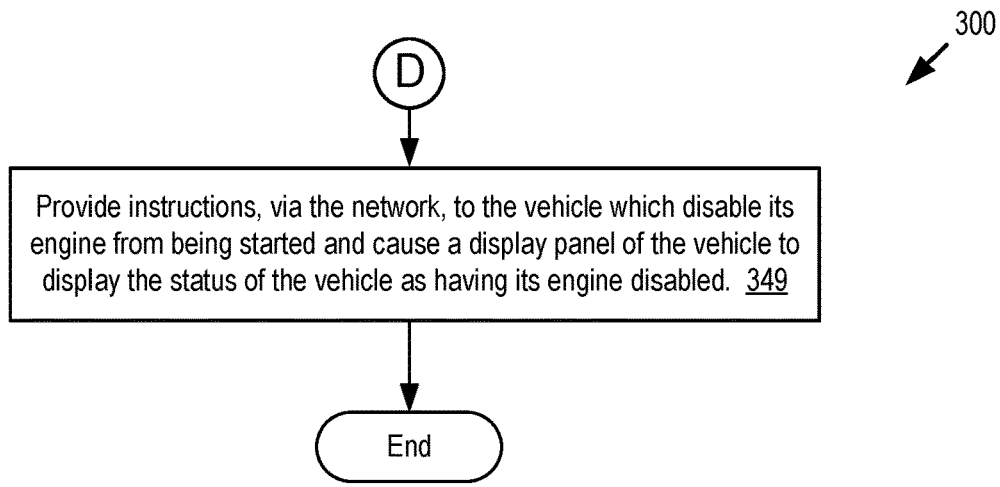

Referring to FIG. 3E, at step 349 electronic instructions are provided, via the network, to the vehicle which disable its engine from being started and cause a display panel of the vehicle to display the status of the vehicle as having its engine disabled.

In the above description, for purposes of explanation, numerous specific details are set forth in order to provide a thorough understanding of the specification. It will be apparent, however, to one skilled in the art that the disclosure can be practiced without these specific details. In some instances, structures and devices are shown in block diagram form in order to avoid obscuring the description. For example, the present embodiments can be described above primarily with reference to user interfaces and particular hardware. However, the present embodiments can apply to any type of computer system that can receive data and commands, and any peripheral devices providing services.

Reference in the specification to "some embodiments" or "some instances" means that a particular feature, structure, or characteristic described in connection with the embodiments or instances can be included in at least one embodiment of the description. The appearances of the phrase "in some embodiments" in various places in the specification are not necessarily all referring to the same embodiments.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms including "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present embodiments of the specification can also relate to an apparatus for performing the operations herein. This apparatus may be specially constructed for the required purposes, or it may include a general-purpose computer selectively activated or reconfigured by a computer program stored in the computer. Such a computer program may be stored in a computer-readable storage medium, including, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory, or any type of media suitable for storing electronic instructions, each coupled to a computer system bus.

The specification can take the form of some entirely hardware embodiments, some entirely software embodiments or some embodiments containing both hardware and software elements. In some preferred embodiments, the specification is implemented in software, which includes, but is not limited to, firmware, resident software, microcode, etc.

Furthermore, the description can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A data processing system suitable for storing or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including, but not limited, to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem, and Ethernet cards are just a few of the currently available types of network adapters.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the specification is not described with reference to any particular programming language. It will be appreciated that a variety of programming languages may be used to implement the teachings of the specification as described herein.

The foregoing description of the embodiments of the specification has been presented for the purposes of illustration and description. It is not intended to be exhaustive or to limit the specification to the precise form disclosed. Many modifications and variations are possible in light of the above teaching. It is intended that the scope of the disclosure be limited not by this detailed description, but rather by the claims of this application. As will be understood by those familiar with the art, the specification may be embodied in other specific forms without departing from the spirit or essential characteristics thereof. Likewise, the particular naming and division of the modules, routines, features, attributes, methodologies, and other aspects are not mandatory or significant, and the mechanisms that implement the specification or its features may have different names, divisions, or formats. Furthermore, as will be apparent to one of ordinary skill in the relevant art, the modules, routines, features, attributes, methodologies, and other aspects of the disclosure can be implemented as software, hardware, firmware, or any combination of the three. Also, wherever a component, an example of which is a module, of the specification is implemented as software, the component can be implemented as a standalone program, as part of a larger program, as a plurality of separate programs, as a statically or dynamically linked library, as a kernel-loadable module, as a device driver, or in every and any other way known now or in the future to those of ordinary skill in the art of computer programming. Additionally, the disclosure is in no way limited to embodiment in any specific programming language, or for any specific operating system or environment. Accordingly, the disclosure is intended to be illustrative, but not limiting, of the scope of the specification, which is set forth in the following claims.

What is claimed is:

1. A method comprising:
generating a digital twin of a vehicle associated with an identifier for the vehicle, the digital twin being a digitized version of a real-world vehicle that describes a hardware design and a software design of the vehicle;
receiving digital data describing the vehicle as it exists in a real-world, one or more historical journeys of the vehicle in the real-world, and weather data that describes weather forecasts of future weather events along travel routes included in the one or more historical journeys;
modifying parameters of the digital twin of the vehicle based on the digital data describing the vehicle so that the digital twin is consistent with a depreciated condition of the vehicle as it exists in the real-world;
executing a simulation based on the digital twin and the one or more historical journeys of the vehicle;
estimating that a component of the vehicle will fail at a future time based on the simulation; and
scheduling a reservation to repair the component before the future time so that the component does not fail in the real-world.

2. The method of claim 1, further comprising:
providing a reservation confirmation for the reservation and a cost estimate for the repair to a driver of the vehicle.

3. The method of claim 1, wherein:
the digital data describes a state of the component of the vehicle and the component is selected from a group that consists of: an engine; a brake; a brake line; a fuel injector; a fuel line; a power steering unit; a transmission; a tire; a filter; a vehicle fluid; a brake pad; a brake rotor; a sensor; an onboard vehicle computer; a windshield; a battery; a windshield wiper; an alternator; a spark plug; a sparkplug wire; a battery wire; a distributor cap; a vehicle body panel; a infotainment system component; and a powertrain component; and
modifying the parameters of the digital twin based on the digital data includes updating the parameters to include an appreciated condition when the component is replaced.

4. The method of claim 1, further comprising displaying a visualization of the component that is estimated to fail at the future time.

5. The method of claim 1, wherein the digital twin replicates (1) the vehicle as indicated by onboard data and measured data and (2) individual components of the vehicle as indicated by the onboard data and the measured data, and wherein the onboard data includes one or more advanced driver assistance systems (ADAS) that generate ADAS data describing an accident that occurred with the vehicle.

6. The method of claim 1, wherein the digital data further includes environment data that describes a roadway environment for the one or more historical journeys.

7. The method of claim 1, wherein multiple instances of the digital data are received over time as part of a feedback loop and the digital twin is recursively updated based on the digital data received in the feedback loop.

8. The method of claim 7, further comprising executing additional simulations responsive to receiving additional instances of the digital data from the feedback loop.

9. A system comprising:
a non-transitory memory storing digital data describing a vehicle as it exists in a real-world, one or more historical journeys of the vehicle in the real-world, and weather data that describes weather forecasts of future weather events along travel routes included in the one or more historical journeys; and
a processor that is communicatively coupled to the non-transitory memory, wherein the non-transitory memory stores computer code which, when executed by the processor, causes the processor to:
generate a digital twin of the vehicle associated with an identifier for the vehicle, the digital twin being a digitized version of a real-world vehicle that describes a hardware design and a software design of the vehicle;

modify parameters of the digital twin of the vehicle based on the digital data describing the vehicle so that the digital twin is consistent with a depreciated condition of the vehicle as it exists in the real-world;

execute a simulation based on the digital twin and the one or more historical journeys of the vehicle;

estimate that a component of the vehicle will fail at a future time based on the simulation; and schedule a reservation to repair the component before the future time so that the component does not fail in the real-world.

10. The system of claim 9 further comprising the non-transitory memory storing additional computer code which, when executed by the processor, causes the processor to provide a reservation confirmation for the reservation and a cost estimate for the repair to a driver of the vehicle.

11. The system of claim 9, wherein:

the digital data describes a state of the component of the vehicle and the component is selected from a group that consists of: an engine; a brake; a brake line; a fuel injector; a fuel line; a power steering unit; a transmission; a tire; a filter; a vehicle fluid; a brake pad; a brake rotor; a sensor; an onboard vehicle computer; a windshield; a battery; a windshield wiper; an alternator; a spark plug; a sparkplug wire; a battery wire; a distributor cap; a vehicle body panel; a infotainment system component; and a powertrain component; and modifying the parameters of the digital twin based on the digital data includes updating the parameters to include an appreciated condition when the component is replaced.

12. The system of claim 9, wherein the computer code further causes the processor to display a visualization of the component that is estimated to fail at the future time.

13. The system of claim 9, wherein the digital twin replicates (1) the vehicle as indicated by onboard data and measured data and (2) individual components of the vehicle as indicated by the onboard data and the measured data, and wherein the onboard data includes one or more advanced driver assistance systems (ADAS) that generate ADAS data describing an accident that occurred with the vehicle.

14. The system of claim 9, wherein the vehicle is a Highly Autonomous Vehicle.

15. The system of claim 9, wherein multiple instances of the digital data are received over time as part of a feedback loop and the digital twin is recursively updated based on the digital data received in the feedback loop.

16. A computer program product comprising a non-transitory memory storing computer-executable code that, when executed by a processor, causes the processor to:

generate a digital twin of a vehicle associated with an identifier for the vehicle, the digital twin being a digitized version of a real-world vehicle that describes a hardware design and a software design of the vehicle;

receive digital data describing the vehicle as it exists in a real-world, one or more historical journeys of the vehicle in the real-world, and weather data that describes weather forecasts of future weather events along travel routes included in the one or more historical journeys;

modify parameters of the digital twin of the vehicle based on the digital data describing the vehicle so that the digital twin is consistent with a depreciated condition of the vehicle as it exists in the real-world;

execute a simulation based on the digital twin and the one or more historical journeys of the vehicle;

estimate that a component of the vehicle will fail at a future time based on the simulation; and schedule a reservation to repair the component before the future time so that the component does not fail in the real-world.

17. The computer program product of claim 16 further comprising providing a reservation confirmation for the reservation and a cost estimate for the repair to a driver of the vehicle.

18. The computer program product of claim 16, wherein:

the digital data describes a state of the component of the vehicle and the component is selected from a group that consists of: an engine; a brake; a brake line; a fuel injector; a fuel line; a power steering unit; a transmission; a tire; a filter; a vehicle fluid; a brake pad; a brake rotor; a sensor; an onboard vehicle computer; a windshield; a battery; a windshield wiper; an alternator; a spark plug; a sparkplug wire; a battery wire; a distributor cap; a vehicle body panel; a infotainment system component; and a powertrain component; and modifying the parameters of the digital twin based on the digital data includes updating the parameters to include an appreciated condition when the component is replaced.

19. The computer program product of claim 16, wherein the computer-executable code further causes the processor to display a visualization of the component that is estimated to fail at the future time.

20. The computer program product of claim 16, wherein the future time includes a threshold base on a distance traveled by the vehicle in the real-world.

\* \* \* \* \*